United States Patent
Doorenbos

(10) Patent No.: US 8,308,358 B2
(45) Date of Patent: Nov. 13, 2012

(54) CIRCUIT AND METHOD FOR BETA VARIATION COMPENSATION IN SINGLE-TRANSISTOR TEMPERATURE SENSOR

(75) Inventor: Jerry L. Doorenbos, Tucson, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 617 days.

(21) Appl. No.: 12/456,991

(22) Filed: Jun. 25, 2009

(65) Prior Publication Data

US 2010/0329304 A1 Dec. 30, 2010

(51) Int. Cl.
*G01K 7/00* (2006.01)

(52) U.S. Cl. .................. 374/172; 374/170; 374/178

(58) Field of Classification Search .................. 374/178, 374/170, 172
See application file for complete search history.

(56) References Cited

U.S. PATENT DOCUMENTS

| | | | | |
|---|---|---|---|---|
| 6,811,309 | B1* | 11/2004 | Ravishanker | 374/178 |
| 7,504,977 | B2 | 3/2009 | Doorenbos et al. | 341/143 |
| 7,524,109 | B2 | 4/2009 | Gardner et al. | 374/178 |
| 2008/0123238 | A1* | 5/2008 | Campos et al. | 361/103 |
| 2008/0165826 | A1* | 7/2008 | Cheng et al. | 374/178 |
| 2008/0259989 | A1 | 10/2008 | Doorenbos et al. | 374/1 |
| 2008/0259997 | A1 | 10/2008 | Gardner et al. | 374/170 |
| 2009/0129438 | A1* | 5/2009 | Pan | 374/170 |

OTHER PUBLICATIONS

"EMC1402 Datasheet", SMSC Success by Design, Revision 1.17 (May 24, 2007), pp. 1-36.
"EMC1403/EMC1404 Data Sheet", SMSC Success by Design, Revision 1.24 (Feb. 5, 2008), pp. 1-43.
"LM95231 TruTherm™ Precision Dual Remote Diode Temperature Sensor with SMBus Interface", National Semiconductor, Advance Information, Feb. 2005, pp. 1-4.
"LM95234 Quad Remote Diode and Local Temperature Sensor with SMBus Interface and TruTherm™ Technology", National Semiconductor, Feb. 2007, pp. 1-38.
"LM95241 Dual Remote Temperature Sensor with SMBus Interface and TruTherm™ Technology (65nm/90nm)", National Semiconductor, Sep. 2006, pp. 1-19.

* cited by examiner

*Primary Examiner* — Lisa Caputo
*Assistant Examiner* — Mirellys Jagan
(74) *Attorney, Agent, or Firm* — John J. Patti; Wade J. Brady, III; Frederick J. Telecky, Jr.

(57) ABSTRACT

A circuit (1-2) for compensating for variations in the current gain β of a sensing transistor (Q1) having a collector coupled to a reference voltage (GND) includes a first current mirror (20) having an input coupled to a base of the sensing transistor. A second current mirror (21) has an input coupled to an output of the first current mirror. A current source (13) is coupled to provide emitter current for the sensing transistor. An output of the second current mirror circuit (21) feeds base current of the sensing transistor back to its emitter to cause the collector current of the sensing transistor to be precisely equal to the current (I1) provided by the current source.

24 Claims, 9 Drawing Sheets

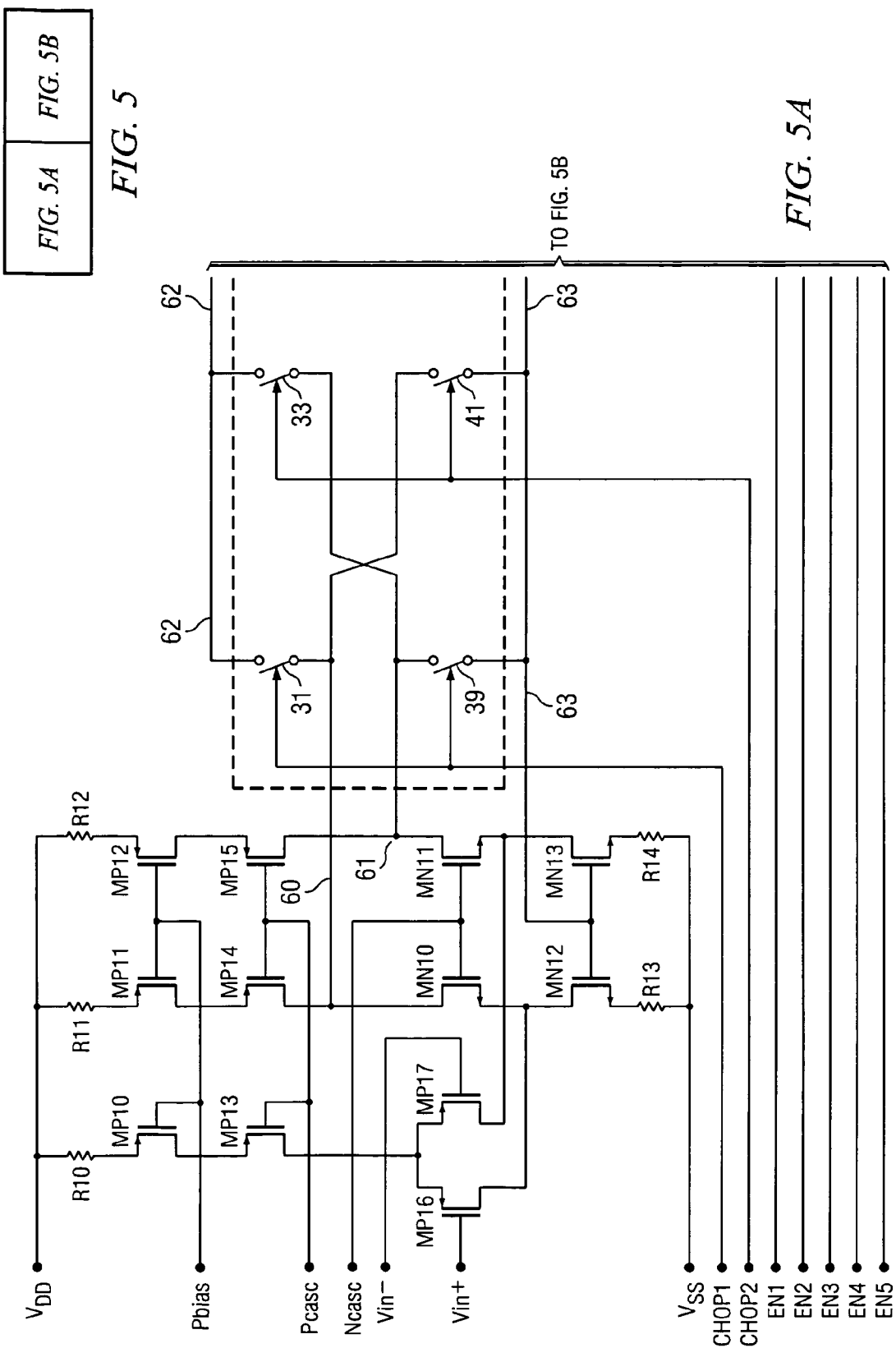

CIRCUIT AND METHOD FOR BETA VARIATION COMPENSATION IN SINGLE-TRANSISTOR TEMPERATURE SENSOR

BACKGROUND OF THE INVENTION

The present invention relates generally to circuits and methods of compensating for variations in the current gain beta (β) of a transistor, and more particularly to circuits and methods of compensating for variations in the β of a single transistor used to measure temperature in an integrated circuit.

It is desirable to measure temperatures of silicon chips in various integrated circuit applications. One common method for achieving this is to measure a chip temperature using a single-temperature sensing transistor which has its base and emitter electrodes available for connection to temperature-measuring circuitry that may be on the same chip as the sensing transistor or on a different chip. The collector of the sensing transistor usually is connected to a reference voltage, such as ground or $V_{DD}$.

"Prior Art" FIG. 1 shows a schematic diagram of the Assignee's commercially available TMP 411 remote temperature sensor integrated circuit product 1-1 which measures the junction temperature of a temperature-sensing vertical PNP transistor Q1 having its collector connected to ground. The emitter of sensing transistor Q1 is coupled by a conductor 2 and an anti-aliasing filter R5,R6,C2 to a (+) input of an integrating ADC (analog-to-digital converter) circuit 6 which produces a digital output on bus 7. The base of sensing transistor Q1 is coupled by conductor 3 and anti-aliasing filter R5,R6,C2 to a (−) input of ADC 6. A filter capacitor C1 is coupled between conductors 2 and 3. A current source I1 is coupled between $V_{DD}$ and conductor 2, and a current source I2 is coupled between $V_{DD}$ and conductor 3. A diode-connected PNP transistor Q2 has its emitter coupled to conductor 3 and its base and collector connected to ground. While this technique is simple and robust, it has the disadvantages that it is quite variable due to temperature variation of the chip and also is variable with the excitation current I1, especially for a low value of β.

In state-of-the-art integrated circuit manufacturing processes having line widths and spacings less than approximately 90 nanometers, the β (collector current divided by base current) of the sensing transistor (which typically is a vertical PNP "substrate" transistor) has a low, widely variable value. It is usually assumed that the β of sensing transistor Q1 (FIG. 1) is independent of its collector current. However, with line widths and spacings having values substantially less than 90 nanometers, that assumption becomes incorrect. The physics of a transistor shows that the base-emitter voltage $V_{BE}$ of the sensing transistor is basically a function of its collector current. If the current gain β of sensing transistor Q1 is not essentially independent of its collector current, rather than its emitter current, its base-emitter voltage $V_{BE}$ cannot be accurately calculated from the emitter current of that transistor.

In operation, current source 22 in FIG. 1 drives the current I2 through transistor Q2 in order to establish a bias voltage V3 on conductor 3. Current source I1 forces a first value of I1 into the emitter of sensing transistor Q1, causing the base current of sensing transistor Q1 to flow through conductor 3. The resulting collector current of sensing transistor Q1 flows into ground, causing a first value of $V_{BE}$ corresponding to the first value of I1. Integrating ADC 6 samples the first value of the base-emitter voltage $V_{BE}$ of sensing transistor Q1 after it has been filtered by anti-aliasing filter R5,R6,C2. Then a different second value of current I1 is forced through the emitter of sensing transistor Q1, which generates a second value of $V_{BE}$ voltage. Integrating ADC 6 samples that value of $V_{BE}$ and subtracts it from the first value of $V_{BE}$. Thus, ADC 6 captures the difference between the two $V_{BE}$ voltages, and that $V_{BE}$ voltage difference is proportional to the absolute temperature of sensing transistor Q1.

The previous generations of "remote junction temperature sensor" integrated circuit products operate by controlling the emitter current, rather than the collector current, of the sensing transistor Q1, and use offset voltages and/or gain correction techniques to compensate for non-ideal characteristics of the sensing transistor. This prior technique of controlling the emitter current of the vertical PNP sensing transistor Q1 works well for systematic non-idealities, including the reduction of β and the increase in the variability of β as the spacings and line widths decrease substantially below 90 nanometers and also including various other non-ideal transistor parameter behavior, and has resulted in acceptably accurate temperature measurements. However, for present state-of-the-art manufacturing processes the chip-to-chip variation of the current gain β of the vertical PNP sensing transistor Q1 is great enough to cause large errors in the temperature measurements achieved by means of remote temperature sensor circuits such as the one shown in Prior Art FIG. 1. For example, present state-of-the-art manufacturing processes using line widths and spacings less than approximately 90 nanometers use doping levels that result in low, variable values of β which cannot be assumed to be independent of the collector current for the vertical PNP transistor Q1. Some prior art remote temperature sensor integrated circuits may utilize some kind of compensation for variations in the β of the temperature-sensing transistors thereof.

FIG. 2 shows the temperature measurement error in degrees Centigrade for a 1% change in β versus current gain β for the temperature measurement circuit 1-1 of Prior Art FIG. 1. Since sensing transistor Q1 typically is a vertical PNP with its collector connected to ground, it has been expedient to directly control the emitter current, as only the emitter and base electrodes of a vertical PNP transistor are accessible.

To avoid the effects of such increasing temperature measurement error caused by decreasing values of β in remote temperature sensor circuits such as the one shown in Prior Art FIG. 1 wherein the emitter current, rather than the collector current, of the vertical PNP sensing transistor Q1 is directly controlled, a circuit is needed which will control collector current instead of emitter current.

More specifically, the above mentioned variability of the β of the temperature-sensing transistor Q1 causes large errors in the temperature measurement values generated by the prior single-sensing-transistor temperature measurement circuits wherein precisely ratioed emitter currents are forced through the sensing transistor Q1 to generate a PTAT (proportional to absolute temperature) voltage $\Delta V_{BE}$, $\Delta V_{BE}$ being the difference between the base-emitter $V_{BE}$ voltages of sensing transistor Q1 in response to the ratioed emitter currents. The large errors referred to are due to the fact that the base-emitter voltage $V_{BE}$ of a bipolar transistor depends directly on its collector current, and therefore current ratio values which are based on the collector current of the sensing transistor may be substantially different than corresponding current ratio values based on the emitter current thereof.

Thus, a major shortcoming of Prior Art FIG. 1 is that the emitter current of sensing transistor Q1, rather than the collector current, is what is directly controlled. As long as β is constant with respect to the controlled emitter current, or as long as β is fairly high in value, e.g., greater than approximately 10, the technique of Prior Art FIG. 1 provides a fairly accurate method of sensing the junction temperature of sensing transistor Q1, and the method of controlling the emitter current is acceptable. However, in modern integrated circuit manufacturing processes, the β of a vertical PNP transistor typically is very low, and furthermore, β changes as a function of current. So even though the ratio between a first emitter current and a second emitter current of sensing transistor Q1 is controlled, there is a completely different ratio between the corresponding first collector current and the corresponding second collector current. Therefore, the ratio of the first collector current to the second collector current is not accurately known. That causes significant errors in the ability of the circuit shown in Prior Art FIG. 1 to accurately measure the junction temperature of sensing transistor Q1, because only the emitter current, rather than the collector current, is directly controlled.

Thus, there is an unmet need for an improved circuit and method which use a single sensing transistor to measure the temperature of an integrated circuit chip wherein fabrication process characteristics cause low and variable values of the current gain β of the sensing transistor.

There also is an unmet need for a way of avoiding temperature measurement errors due to very low and/or widely varying values of the current gain β of a sensing transistor in an integrated circuit chip wherein fabrication process characteristics cause low and variable values of the current gain β of the sensing transistor.

There also is an unmet need for a way to precisely control the collector current in a temperature sensing transistor of a temperature sensor circuit wherein characteristics of the integrated circuit fabrication process being used cause low and variable values of the current gain β of the sensing transistor.

There also is an unmet need for a way of automatically estimating the current gain β of a temperature sensing transistor in an integrated circuit chip wherein fabrication process characteristics cause low and variable values of the current gain β of the sensing transistor.

There also is an unmet need for a way of automatically adjusting/optimizing various circuit parameters an integrated circuit chip wherein fabrication process characteristics cause low and variable values of the current gain β of a temperature sensing transistor.

SUMMARY OF THE INVENTION

It is an object of the invention to provide an improved circuit and method which use a single sensing transistor to measure the temperature of an integrated circuit chip wherein fabrication process characteristics cause low and variable values of the current gain β of the sensing transistor.

It is another object of the invention to provide a way of avoiding temperature measurement errors due to very low and/or widely varying values of the current gain β of a sensing transistor in an integrated circuit chip wherein fabrication process characteristics cause low and variable values of the current gain β of the sensing transistor.

It is another object of the invention to provide a way to precisely control the collector current in a temperature sensing transistor of a temperature sensor circuit wherein characteristics of the integrated circuit fabrication process being used cause low and variable values of the current gain β of the sensing transistor.

It is another object of the invention to provide a way of automatically estimating the current gain β of a temperature sensing transistor in an integrated circuit chip wherein fabrication process characteristics cause low and variable values of the current gain β of the sensing transistor.

It is another object of the invention to provide a way of automatically adjusting/optimizing various circuit parameters an integrated circuit chip wherein fabrication process characteristics cause low and variable values of the current gain β of a temperature sensing transistor.

Briefly described, and in accordance with one embodiment, the present invention provides a circuit (1-2) for compensating for variations in the current gain β of a sensing transistor (Q1) having a collector coupled to a reference voltage (GND) includes a first current mirror (20) having an input coupled to a base of the sensing transistor. A second current mirror (21) has an input coupled to an output of the first current mirror. A current source (13) is coupled to provide emitter current for the sensing transistor. An output of the second current mirror circuit (21) feeds base current of the sensing transistor back to its emitter to cause the collector current of the sensing transistor to be precisely equal to the current (I1) provided by the current source.

In one embodiment, the invention provides A circuit (1-2) for compensating for variations in the current gain β of a first transistor (Q1) having a collector coupled to a first reference voltage (GND), the circuit (1-2) including a first current mirror circuit (20) having an input coupled to a base of the first transistor (Q1). A second current mirror circuit (21) has an input coupled to an output of the first current mirror circuit (20). A current source (13) is coupled to an emitter of the first transistor (Q1) for producing an excitation current (I1) to provide emitter current for the first transistor (Q1). An output of the second current mirror circuit (21) is coupled to the emitter of the first transistor (Q1).

In one embodiment, the first current mirror circuit (20) includes a first amplifier (A1), a first resistor (R1), a second resistor (R2), and a second transistor (M1), the first amplifier (A1) having a first input (+) coupled to a base of the first transistor (Q1) and a first terminal of the first resistor (R1), a second input (−) coupled to a first terminal of the second resistor (R2) and a source of the second transistor (M1), a second terminal of the second resistor (R2) being coupled to a second terminal of the first resistor (R1), and an output coupled to a gate of the second transistor (M1). The second current mirror circuit (21) includes a second amplifier (A2), a third resistor (R3), a fourth resistor (R4), and a third transistor (M2), the second amplifier (A2) having a first input (+) coupled to a first terminal of the third resistor (R3), a second input (−) coupled to a first terminal of the fourth resistor (R4) and a source of the third transistor (M2), and an output coupled to a gate of the third transistor (M2), a second terminal of the third resistor (R3) and a second terminal of the fourth resistor (R4) being coupled to a second reference voltage ($V_{DD}$). The second transistor (M1) has a drain coupled to the first input (+) of the second amplifier (A2), and the third transistor (M2) has a drain coupled to the emitter of the first transistor (Q1).

In a described embodiment, the first transistor (Q1) is a temperature sensing transistor, and the emitter of the first transistor (Q1) is coupled to a first input (+) of an averaging analog to digital converter (6) and the base of the first transistor (Q1) is coupled to a second input (−) of the averaging analog to digital converter (6). In one embodiment, a third amplifier (A3) has a first input (+) coupled to a third reference voltage ($V_{Ref}$), a second input (−) coupled to the base of the first transistor (Q1), and an output (8) coupled to the second terminal of the first resistor (R1) and the second terminal of the second resistor (R2).

In one embodiment, the emitter of the first transistor (Q1) is coupled to the first input (+) of the averaging analog to digital converter (6) by means of a fifth resistor (R5) and the base of the first transistor (Q1) is coupled to the second input (−) of the averaging analog to digital converter (6) by means of a sixth resistor (R6). A capacitor (C2) is coupled between the first (+) and second (−) inputs of the averaging analog to digital converter (6) to form an anti-aliasing filter that also includes the fifth (R5) and sixth (R6) resistors.

In one embodiment, a comparator (23) has a first input (+) coupled to a fourth reference voltage ($V_{TH}$) representative of an estimated value of the current gain β of the first transistor (Q1), a second input (−) coupled to the output (8) of the third amplifier (A3), and an output (9) for indicating whether a present value of the β of the first transistor (Q1) is greater than or less than a predetermined value of the β of the first transistor (Q1) represented by the fourth reference voltage ($V_{TH}$).

In a described embodiment, detection circuitry (40) incrementally sets multiple values of the excitation current (I1) to cause the first transistor (Q1) to produce corresponding values of its base current and thereby cause corresponding voltages to be produced on the second input (−) of the comparator (23). Circuitry (40) is provided to cause the excitation current (I) to have one of the values according to a stored list of values of $I_{UNIT}$, wherein $I_{UNIT}$ is a predetermined minimum value of the excitation current (I1). The first (R1) and second (R2) resistors are implemented by means of at least one programmable resistor circuit (14), wherein resistances of first (R1') and second (R2') portions of the programmable resistor circuit (14) are adjustable in response to whether a present β of the first transistor (Q1) is greater than or less than the predetermined value of the β of the first transistor (Q1) represented by the fourth reference voltage ($V_{TH}$), and wherein the first (R1) and second (R2) resistors include the first (R1') and second (R2'), respectively, of the programmable resistor circuit (14).

In a described embodiment, each of the first amplifier (A1) and the second amplifier (A2) are chopper-stabilized to reduce input offset voltages thereof. In a described embodiment, the second transistor (M1) is composed of multiple segments (MN47,49,51,53) which are selectable in accordance with values of the excitation current (I1). In a described embodiment, a plurality of compensation capacitors are selectable in accordance with the values of the excitation current (I1).

In a described embodiment, the invention provides a method of compensating for variations in current gain β of a sensing transistor (Q1) having a collector coupled to a first reference voltage (GND), including causing an excitation current (I1) to flow through an emitter of the sensing transistor (Q1), causing a resulting base current in the sensing transistor (Q1) to flow into an input of a first current mirror circuit (20), causing a first mirrored current produced by the first current mirror circuit (20) to flow into an input of a second current mirror circuit (21), and causing a second mirrored current produced by the second current mirror circuit (21) to flow through the emitter of the sensing transistor (Q1) to cause a current precisely equal to the excitation current (I1) to flow through the collector of the sensing transistor (Q1). In one embodiment, the method includes chopper-stabilizing each of the first current mirror (20A) and the second current mirror (21A) to reduce errors associated with the first (20A) and second (21A) current mirror circuits. In one embodiment, the method includes coupling the emitter of the sensing transistor (Q1) to a first input (+) of an averaging analog to digital converter (6) and coupling a base of the sensing transistor (Q1) to a second input (−) of the averaging analog to digital converter (6) and operating the averaging analog to digital converter (6) to measure base-emitter voltages of the sensing transistor (Q1) produced in response to different values of the excitation current (I1), and determining the temperature of the sensing transistor (Q1) from the measured base-emitter voltages.

In one embodiment, the method includes operating β detection circuitry (40) by incrementing the excitation current (I1) to cause the sensing transistor (Q1) to produce corresponding values of its base current and causing corresponding voltages generated across the first resistor (R1) to be compared by means of a comparator (23) to a predetermined reference voltage ($V_{TH}$) representative of a predetermined value of the β of the switching transistor (Q1) to determine a value of the β the sensing transistor (Q1). A value of the excitation current (I1) is set in accordance with the determined value of the β of the sensing transistor (Q1).

In one embodiment, the invention provides a circuit for compensating for variations in current gain β of a first transistor (Q1) having a collector coupled to a first reference voltage (GND), including means (13) for causing an excitation current (I1) to flow through an emitter of the sensing transistor (Q1), means (3) for causing a resulting base current in the sensing transistor (Q1) to flow into an input of a first current mirror circuit (20), means (12) for causing a first mirrored current produced by the first current mirror circuit (20) to flow into an input of a second current mirror circuit (21), and means (12) for causing a second mirrored current produced by the second current mirror circuit (21) to flow through the emitter of the sensing transistor (Q1) to cause a current precisely equal to the excitation current (I1) to flow through the collector of the sensing transistor (Q1).

DETAILED DESCRIPTION OF THE PREFERRED EMBODIMENTS

Figure 3:
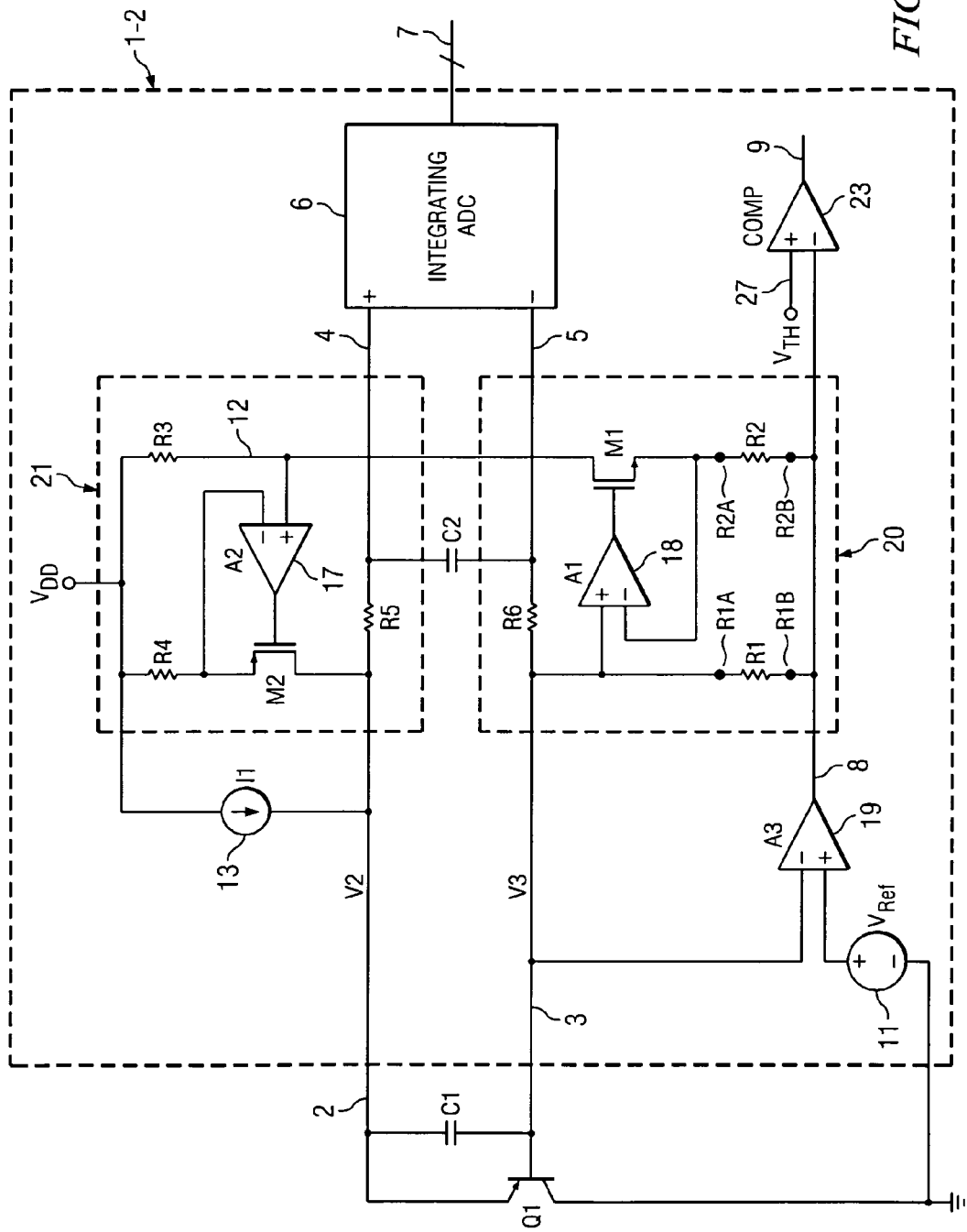
FIG. 3 is a schematic diagram of a remote temperature measurement circuit according to the present invention.

FIG. 3 shows a schematic diagram of a remote temperature sensor integrated circuit product 1-2 for sensing the junction temperature of a vertical PNP temperature-sensing transistor Q1 having its collector connected to ground. Sensing transistor Q1 may be located on the same integrated circuit chip as remote temperature sensor integrated circuit product 1-2 or on a different chip. The emitter of sensing transistor Q1 is coupled by conductor 2 and anti-aliasing filter R5,R6,C2 to a (+) input of an integrating ADC (analog-to-digital converter) circuit 6 which produces a digital output on bus 7. The base of sensing transistor Q1 is coupled by conductor 3 and anti-aliasing filter R5,R6,C2 to a (−) input of integrating ADC 6. A filter capacitor C1 is coupled between conductors 2 and 3. A current source 13, which may be programmable, is coupled between $V_{DD}$ and conductor 2 and generates a current I1. This much of remote temperature sensor 1-2 can be essentially the same as in Prior Art FIG. 1.

Remote temperature sensor 1-2 also includes additional circuitry and logic registers which have been added in order to support detection and compensation of the current gain β of sensing transistor Q1 in accordance with the present invention. The β compensation and detection circuitry in FIG. 3 includes current mirrors 20 and 21 and a comparator 23. The (−) input of an amplifier 19, also referred to as amplifier A3, is connected to conductor 3. The (+) input of amplifier A3 is connected to a voltage reference circuit 11 which applies a reference voltage $V_{Ref}$, which may be programmable, to the (+) input of amplifier A3. The output of amplifier A3 is connected by conductor 8 to a low side reference voltage terminal of current mirror 20 and to the (−) input of comparator 23. The (+) input of comparator 23 is connected to receive a reference voltage $V_{TH}$, which may be programmable.

Current mirror circuit 20 includes an amplifier 18, also referred to as amplifier A1, having its (+) input connected to receive the voltage V3 on conductor 3 and its (−) input connected to the source of a N-channel output transistor M1. The (+) input of amplifier A1 also is coupled by resistor R1 to conductor 8. The gate of output transistor M1 is connected to the output of amplifier A1. The source of output transistor M1 is also coupled by resistor R2 to conductor 8. The drain of output transistor M1 is connected by conductor 12 to the output of current mirror 20. (Note that the terms R1 and R2 are used interchangeably herein to designate either or both of the physical resistors and/or their respective resistance values.)

Current mirror circuit 21 includes an amplifier 17, also referred to as amplifier A2, having its (+) input connected by conductor 12 to receive output current produced by current mirror 20. The (+) input of amplifier A2 also is coupled by resistor R3 to $V_{DD}$. Amplifier A2 has its (−) input connected to the source of a P-channel output transistor M2. The gate of output transistor M2 is connected to the output of amplifier A2. The source of output transistor M2 is coupled by resistor R4 to $V_{DD}$. The drain of output transistor M2 is connected by conductor 2 to the emitter of sensing transistor Q1.

Remote temperature sensor 1-2 of FIG. 3 preferably includes the capability of automatically detecting and choosing a suitable range of bias current values for the excitation current I1 forced by current source 13 to flow through sensing transistor Q1, depending on the value of the current gain β thereof. Remote temperature sensor 1-2 operates satisfactorily for vertical PNP sensing transistors with β values as low as 0.1. The above described β compensation circuitry of remote temperature sensor 1-2 may also include a disable function to allow a PNP or NPN diode-connected transistor to be used as the temperature-sensing transistor. A capability of providing compensation for the series resistance of sensing transistor Q1, similar to the capability of the Assignee's above mentioned TMP 411 product as generally shown in Prior Art FIG. 1, can be included in remote temperature sensor 1-2 of FIG. 3. (See the assignee's subsequently mentioned issued U.S. Pat. No. 7,524,109.)

Figure 1:
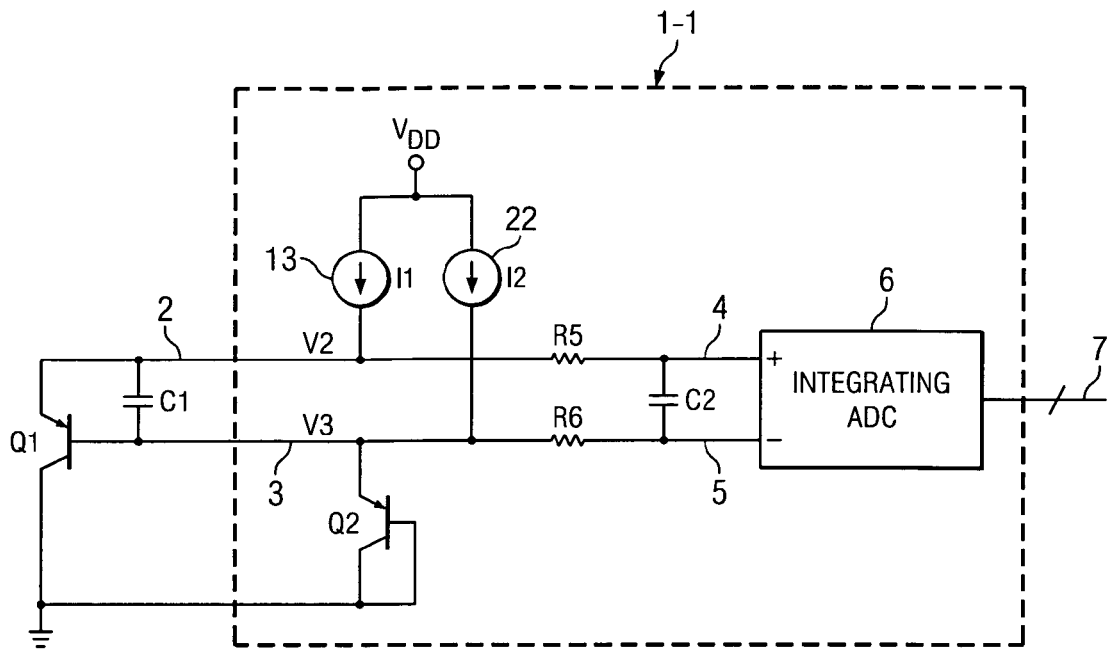
FIG. 1 is a schematic diagram of a prior art remote temperature measurement circuit.
Figure 2:
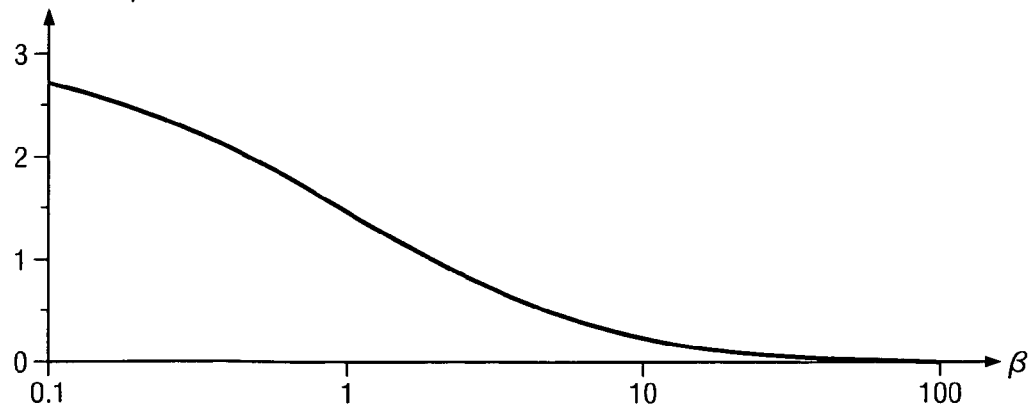
FIG. 2 is a graph illustrating error in temperature measurements made by the circuit of FIG. 1 as a result of changes in the current gain β of the sensing transistor therein.

In accordance with the present invention, remote temperature sensor circuit 1-2 of FIG. 3 controls the collector current, rather than the emitter current, of sensing transistor Q1 and thereby substantially eliminates the effects of the previously described sources of error and variability in the β of sensing transistor Q1, and thereby also substantially eliminates the error and variability of the temperature measurements made by remote temperature sensor 1-1 in Prior Art FIG. 1. In accordance with the present invention, the current source 22 (I2) and transistor Q2 shown in Prior Art FIG. 1 have been replaced in FIG. 3 by β compensation circuitry including current mirrors 20 and 21. Amplifier A3 in FIG. 3 receives $V_{Ref}$ on its (+) input and, by means of feedback through resistor R1, causes the voltage V3 on conductor 3 to be equal to $V_{Ref}$. Amplifier A1 of current mirror 20, with its associated feedback through output transistor M1 of current mirror 20 and resistor R2 of current mirror 21, precisely senses the base current of sensing transistor Q1 and also controls the base voltage of sensing transistor Q1 so as to cause it to equal $V_{Ref}$.

The collector-base voltage of sensing transistor Q1 in FIG. 3 is maintained constant independently of the current I1 produced by current source 13 and independently of the specific characteristics of current mirrors 20 and 21. This is in direct contrast to the circuit of Prior Art FIG. 1, which has the limitation that the base current of sensing transistor Q1 is quite variable due to the low and/or widely variable value of the current gain β of sensing transistor Q1 that occurs in the case wherein the integrated circuit manufacturing process being used has line widths and spacings substantially less than 90 nanometers. The variable value of the β of sensing transistor Q1 in Prior Art FIG. 1 causes its base current and base voltage to be variable. The base voltage V3 of sensing transistor Q1 is also variable due to the different values of excitation current I1 that are sequentially forced into the emitter of sensing transistor Q1 in order to measure its temperature.

The base voltage V3 of sensing transistor Q1 in FIG. 3 generally is close to ground but may be biased enough above ground to accommodate slight differences between the ground voltages on the chip on which sensing transistor Q1 is located and a different chip 1 on which the temperature measurement circuitry 1-2 is located. Amplifier A3 in FIG. 3 maintains the collector-base voltage of sensing transistor Q1 at a suitable level and also maintains the voltage V3 on conductor 3 at a suitable level $V_{Ref}$ above ground. However, if only resistor R1 in FIG. 3 is provided, i.e., without amplifier A3, then the collector-base voltage of sensing transistor Q1 is variable and dependent on the amount of base current in sensing transistor Q1. Also, in this case the variation in the magnitude of the base voltage of sensing transistor Q1 due to forcing the various values of the excitation current I1 needed for temperature measurement can be reduced somewhat by the subsequently described parallel groupings of the resistor networks of subsequently described FIG. 6 used to implement resistors R1 and R2 by connecting different parallel combinations of the scaled switched resistor networks of FIG. 6 in the manner subsequently described with reference to FIG. 7. In some cases, this may provide a significant advantage of the present invention over the prior art.

In FIG. 3, ADC 6 measures the voltage V2-V3 between conductors 2 and 3 in order to measure the junction temperature of sensing transistor Q1. Current source 13 provides excitation current I1 to set the collector current of sensing transistor Q1. The base of sensing transistor Q1 is set at approximately 0.7 volts by amplifier A3 by means of the positive feedback path including current mirror 20 (resistor R1, amplifier A1, output transistor M1, and resistor R2) and current mirror 21 (resistor R4, amplifier A2, output transistor M2, and resistor R3). The drain of output transistor M1 is the output of current mirror 20, and feeds the base current of sensing transistor Q1, as mirrored by current mirror 20, through conductor 12 to the input of current mirror 21. The drain of output transistor M2 is the output of current mirror 21, which mirrors the previously mirrored base current (from output transistor M1) back to the emitter of sensing transistor Q1.

The β correction circuitry shown in FIG. 3 operates by sensing the base current of sensing transistor Q1, mirroring that base current, and returning the mirrored base current to the emitter of sensing transistor Q1 to thereby feed back a source of β compensation current to the emitter of sensing transistor Q1, which is added to the bias or excitation current I1 from current source 13. This accurately controls the value of the collector current Ic of sensing transistor Q1 irrespective of its current gain β. The total emitter current Ie of sensing transistor Q1 is equal to I1+Ibb, where Ibb is the mirrored (i.e., mirrored by current mirrors 20 and 21) base current of sensing transistor Q1. The collector current Ic of sensing transistor Q1 is I1+Ibb minus the base current Ib of Q1. The collector current Ic of sensing transistor Q1 then is equal to I1+Ibb−Ib. If current mirrors 20A and 21A are very accurate, then the magnitude of Ibb is equal to that of Ib, so the collector current Ic of sensing transistor Q1 is equal to the excitation current I1.

The illustrated architecture of current mirrors 20 and 21 was chosen because it relies on the good, readily achievable matching of resistors R1-R4, which preferably are thin film resistors, rather than good matching of the various transistors therein, to achieve high gain accuracy of current mirrors 20 and 21. (The input offset voltage of amplifier A1 affects the accuracy, but not the positive feedback loop gain.) As a practical matter, thin film resistors R1-R4 can easily achieve 0.1% matching of current mirrors 20 and 21, so the total positive feedback loop gain error can easily be less than 0.2%, which has a negligible effect on the positive feedback loop until the value of β of sensing transistor Q1 is as low as about 0.02.

Consequently, the current mirror architecture shown in FIG. 3 provides very good matching of the currents through resistors R1 and R2. Furthermore, the architecture of current mirrors 20 and 21 accommodates use of various chopping techniques to correct for the input offset voltage of amplifier A1 to thereby provide the very accurate current mirroring needed in order to deal with the low and variable values of the current gain β of sensing transistor Q1 which occur for state-of-the-art fine-line integrated circuit manufacturing processes (sometimes referred to as "deep sub-micron" processes) having line widths and spacings less than approximately 90 nanometers.

Any error in the previously mentioned mirrored base current Ibb of sensing transistor Q1 would result in an error in the emitter current of sensing transistor Q1, so very accurate mirroring of the base current of sensing transistor Q1 may be necessary. Remote temperature sensor circuit 1-2 of FIG. 3 needs to operate with a value of β which may be as low as 0.1, and it has been determined that a 0.1% error in the mirrored base current Ibb can induce an error of approximately 1% in the emitter current of sensing transistor Q1. A corresponding 1% error in the collector current of sensing transistor Q1 can correspond to as much as 3-4 degrees Centigrade of temperature measurement error. Therefore, it should be appreciated that a high degree of accuracy is required for the β compensation function included in remote temperature sensor circuit 1-2.

To achieve the needed accuracy, a chopping scheme as shown in subsequently described FIG. 4 may be advantageously employed in current mirrors 20 and 21. Providing such chopping circuitry in current mirrors 20 and 21 is readily achievable, since ADC 6 can be an integrating ADC and can automatically filter the voltage ripple generated by any chopping technique. For β=0.1, the positive feedback factor is 0.9. Good accuracy in the circuitry other than the chopping circuitry is also required to ensure that the positive feedback factor does not get too close to 1.0.

It should be appreciated that current mirrors 20 and 21 as shown in FIG. 3, using closely matched resistors R1, R2, R3 and R4, do not depend on the magnitude of the current that flows through these resistors, and consequently the gain of each of current mirrors 20 and 20 as shown in FIG. 3 is very constant across a wide range of current magnitudes, whereas that would not be true for a conventional simple current mirror architecture. Nevertheless, in some cases upper current mirror circuit 21 and the lower current mirror circuit 20 could be ordinary current mirror circuits.

Integrating ADC 6 in FIG. 3 has the processing capability needed to do the required subtractions and averaging operations, and can be conventional. For example, integrating ADC 6 can be implemented in accordance with the assignee's pending published applications, application Ser. No. 11/738, 584, Publication Number 2008/0259999, now issued U.S. Pat. No. 7,524,109 entitled "SYSTEMS AND METHODS FOR RESISTANCE COMPENSATION IN A TEMPERATURE MEASUREMENT CIRCUIT", application Ser. No. 11/738,571, Publication Number 2008/0259997 entitled "SYSTEMS AND METHODS FOR PWM CLOCKING IN A TEMPERATURE MEASUREMENT CIRCUIT", application Ser. No. 11/738,595, Publication Number 2008/0259989 entitled "SYSTEMS AND METHODS FOR TEMPERATURE MEASUREMENT USING N-FACTOR COEFFICIENT CORRECTION", and application Ser. No. 11/738, 566, Publication Number 2008/0258951, now issued U.S. Pat. No. 7,504,977 entitled "HYBRID DELTA-SIGMA/SAR ANALOG TO DIGITAL CONVERTER AND METHODS FOR USING SUCH", all incorporated herein by reference.

Amplifier A1 in current mirror 20 of FIG. 3 (or current mirror 21A of subsequently described FIG. 4) affects the accuracy of the β correction circuitry. The input offset error thereof is largely corrected by chopping, but nevertheless should be reasonably low in magnitude. This input offset error affects the total value of the mirrored current. With β=0.1, a 1% error in the mirrored base current of sensing transistor Q1 affects the collector current of sensing transistor Q1 by approximately 10%. Keeping the error of each of amplifiers A1 and A2 down to approximately 1% with a typical 400 millivolt drop across the current mirrors establishes a maximum offset voltage performance requirement approximately 4 millivolts. Amplifier A1 should have very low input current (i.e., no bipolar input transistors) and should operate in a 0-1 volt common mode input voltage range. Amplifier A1 also should be able to drive the gate of an NMOS transistor very close to the positive supply voltage. Open loop gain should be greater than about 80 dB. Amplifier A2 in current mirror 21 of FIG. 3 (or current mirror 21A of subsequently described FIG. 4) also affects the accuracy of the β correction circuitry. Input offset voltage in amplifier A2 error affects the overall circuit in a similar way to input offset voltage in amplifier A1.

A technique which can be advantageously utilized in remote temperature sensor 1-3 of FIG. 3 is to eliminate the series resistance associated with sensing transistor Q1 by using the technique disclosed in the above incorporatedherein-by-reference Published Patent Application 2008/0259999, by forcing first, second, third, and fourth emitter currents through the sensing transistor, the third emitter current being twice the first one, and the fourth emitter current being twice the second one. By appropriate mathematics, which can be performed in integrating ADC 6, the series resistance associated with sensing transistor Q1 may be eliminated. The above mentioned technique for reducing or eliminating series resistance of the sensing transistor allows use of 4 levels of "ratioed" excitation currents I1 (e.g., $I_{UNIT}$, $2 \times I_{UNIT}$, $10 \times I_{UNIT}$, and $20 \times I_{UNIT}$, where $I_{UNIT}$ is the lowest, basic unit of excitation current), rather than 2 different levels thereof, to be forced into sensing transistor Q1 and using the resulting $V_{BE}$ voltage measurements by ADC 6 to compute the junction temperature of sensing transistor Q1. Without performing the above mentioned resistance correction, only 2 values of excitation current I1 would be used to generate the $V_{BE}$ values needed by ADC 6 to compute the temperature of sensing transistor Q1.

It should be appreciated that the exact value of the base voltage of sensing transistor Q1 is not critical, and therefore use of amplifier A3 is not essential to all embodiments of the present invention. The voltage on conductor 8 to which current mirror circuit 20 is referenced could be a fixed reference voltage, and does not necessarily have to be generated by an amplifier such as A3. In some cases, the voltage on conductor 8 could be a constant voltage. Furthermore, current mirrors 20 and 21 could be basic current mirrors and the β compensation circuitry including current mirrors 20 and 21 nevertheless might operate satisfactorily.

It is important to provide very accurate feeding of the base current of sensing transistor Q1 back to its emitter such that selecting the excitation current I1 produced by current source 13 precisely determines the collector current of sensing transistor Q1. Otherwise, any error introduced by current mirror circuits 20 and 21 causes substantial errors in the collector current of sensing transistor Q1, and this causes substantial errors in the measurement of the junction temperature of sensing transistor Q1. Therefore, it may be advantageous to provide chopping circuitry that averages out offset errors of current mirrors 20 and 21, wherein integrating ADC 6 is configured to accomplish averaging the effect which appears at the output of the chopping circuitry.

Figure 4:
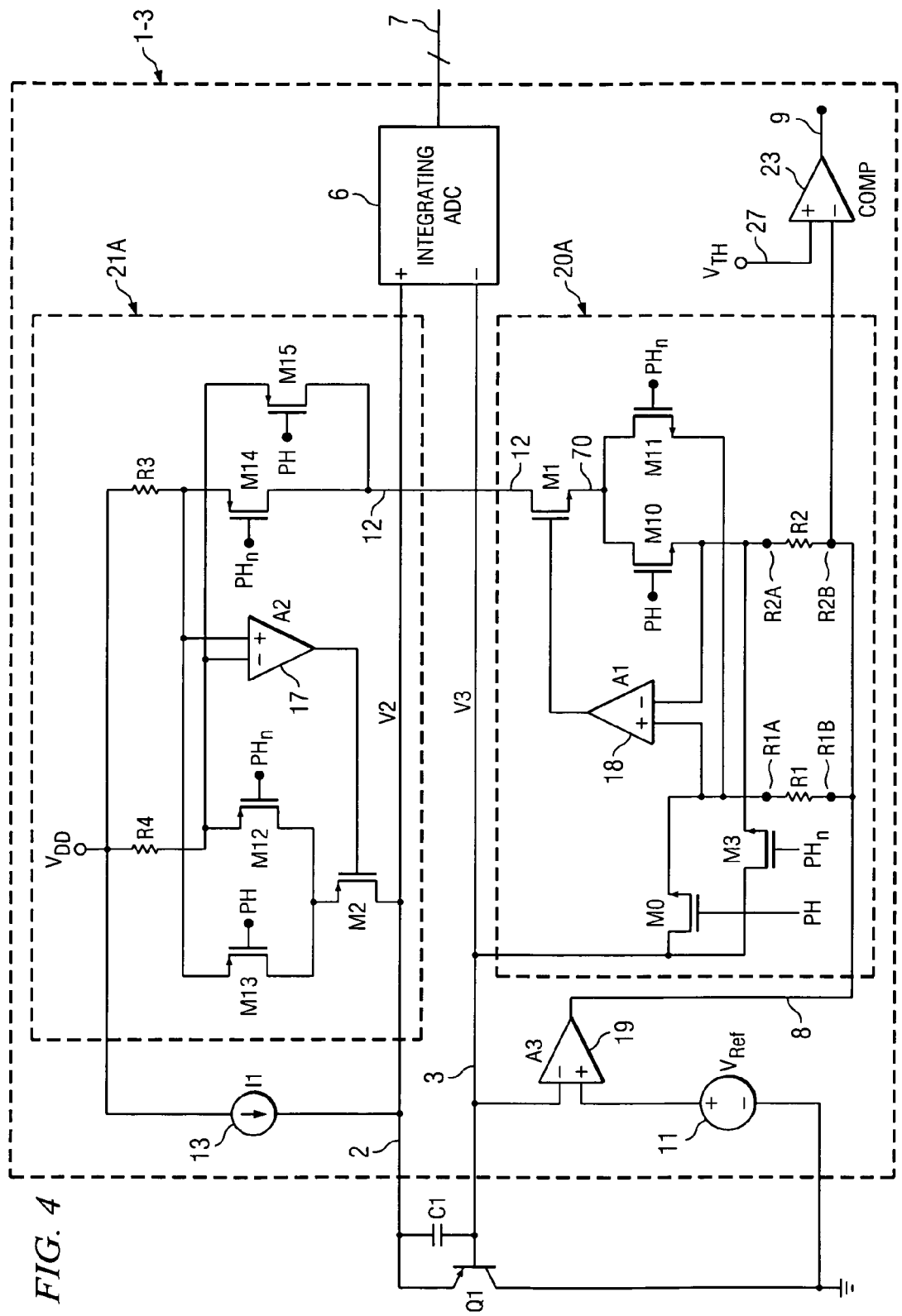
FIG. 4 is a schematic diagram illustrating a chopping implementation of the remote temperature measurement circuit of FIG. 3.

FIG. 4 shows a schematic diagram of a remote temperature sensor integrated circuit 1-3 for measuring the junction temperature of vertical PNP temperature sensing transistor Q1, with its collector connected to ground. As in FIG. 3, the emitter of sensing transistor Q1 is coupled by conductor 2 to a (+) input of an integrating ADC (analog-to-digital converter) circuit 6 which produces a digital output on bus 7. An anti-aliasing filter (not shown) as in FIG. 3 may couple conductor 2 to the (+) input of integrating ADC 6. The base of sensing transistor Q1 is coupled by conductor 3 to a (−) input of integrating ADC 6. The anti-aliasing filter may be used to couple conductor 3 to the (−) input of integrating ADC 6. Filter capacitor C1 may be coupled between conductors 2 and 3. A current source 13, which may be programmable, is coupled between $V_{DD}$ and conductor 2 to provide an excitation current I1 into the emitter of sensing transistor Q1.

The (−) input of amplifier A3 is connected to conductor 3. The (+) input of amplifier A3 is connected to a voltage reference circuit 11 that applies a reference voltage $V_{Ref}$, which may be programmable, to the (+) input of amplifier A3. The output of amplifier A3 is connected by conductor 8 to the low side reference voltage terminal of current mirror 20A, and may also be connected to the (−) input of comparator 23. The (+) input of comparator 23 may be connected to receive a reference voltage $V_{TH}$, which may be programmable.

Current mirror circuit 20A in FIG. 4 includes an amplifier 18, also referred to as amplifier A1, having its (+) input coupled to conductor 3 by means of a N-channel chopping transistor M0. The (−) input of amplifier A1 is coupled to conductor 3 by means of N-channel chopping transistor M3. The (+) input of amplifier A1 also is coupled by resistor R1 to conductor 8, and the (−) input of amplifier A1 also is coupled by resistor R2 to conductor 8. The output of amplifier A1 is coupled to the gate of N-channel output transistor M1, the drain of which is connected to conductor 12. The source of output transistor M1 is coupled by conductor 70 and N-channel chopping transistor M10 to the (−) input of amplifier A1 and the upper terminal of resistor R2, the lower terminal of which is connected to conductor 8. The source of output transistor M1 is also coupled by conductor 70 and N-channel chopping transistor M11 to the (+) input of amplifier A1 and the upper terminal of resistor R1, the lower terminal of which is connected to conductor 8. A clock signal PH is connected to the gates of chopping transistors M0 and M10. The logical complement of clock signal PH is $PH_n$, which is coupled to the gates of chopping transistors M3 and M11.

Current mirror circuit 21A in FIG. 4 includes amplifier 17, also referred to as amplifier A2, having its (+) input coupled to conductor 12 by means of P-channel chopping transistor M14. The (+) input of amplifier A2 also is coupled to $V_{DD}$ by means of resistor R3. The (−) input of amplifier A2 is coupled to conductor 12 by means of P-channel chopping transistor M15. The (−) input of amplifier A2 also is coupled to $V_{DD}$, by means of resistor R4. The output of amplifier A2 is coupled to the gate of P-channel output transistor M2, the source of which is coupled by P-channel chopping transistor M12 to the lower terminal of resistor R4 and the (−) input of amplifier A2. The source of output transistor M2 is also coupled by P-channel chopping transistor M13 to the lower terminal of resistor R3 and to the (+) input of amplifier A2. The drain of output transistor M2 is connected to conductor 2. The clock signal PH is connected to the gates of chopping transistors M13 and M15 and the logical complement signal $PH_n$ is coupled to the gates of chopping transistors M12 and M14.

A two-state chopping technique may be used for simplicity, and is capable of yielding excellent results in eliminating input offset voltages of amplifiers A1 and A2. FIG. 4 shows modified (i.e., modified with respect to FIG. 3) current mirror circuits 20A and 21A with the above mentioned chopping switches added to facilitate chopping of current mirror circuits 20A and 21A. Current mirrors 20A and 21A may be chopped simultaneously by the various chopping transistors controlled by PH to determine the output current of current mirror circuit 20A during PH and simultaneously mirror the resulting mirrored sensing transistor base current received from current mirror 20A back to the emitter of sensing transistor Q1 by means of current mirror 21A. And similarly, current mirrors 20A and 21A are chopped simultaneously by the various chopping transistors controlled by $PH_n$ to determine the output current of current mirror circuit 20A during $PH_n$ and simultaneously mirror the resulting mirrored sensing transistor base current received from current mirror 20A back to the emitter of sensing transistor Q1, by means of current mirror 21A.

When chopping signal PH is at a high level and its logical complement signal $PH_n$ is at a low level, chopping transistors M0, M10, M14, and M12 are turned on so that the base current from sensing transistor Q1 flows in resistor R1 of current mirror 20A. Amplifier A1 therefore drives the gate of output transistor M1 in current mirror 20A, through chopping transistor M10, in such a way as to cause the voltage across resistor R2 to equal the voltage across resistor R1, in order to thereby achieve the current mirroring operation. The current in resistor R2 therefore flows through output transistor M1 and chopping transistor M14 to resistor R3 in current mirror 21A. In current mirror 21A, amplifier A2 generates a voltage similar to the voltage generated in current mirror 20A by amplifier A1 to thereby drive the gate of output transistor M2 in current mirror 21A such that the source of output transistor M2 is coupled through chopping transistor M12 to the lower terminal of resistor R4 and the voltage across resistor R4 in current mirror 21A is the same as the voltage across resistor R3 of current mirror 21A. The precisely twice-mirrored base current of sensing transistor Q1 is thereby returned via conductor 2 to the emitter of sensing transistor Q1.

In the opposite chopping state, when PH is low and $PH_n$ is high, chopping transistors M3, M1, M13, and M15 are turned on so that the base current from the sensing transistor Q1 flows in resistor R2 of current mirror 20A. Amplifier A1 therefore drives the gate of transistor M1 in current mirror 20A, through chopping transistor M11, in such a way as to cause the voltage across resistor R1 to equal the voltage across resistor R2, in order to thereby achieve current mirroring. The current in resistor R1 therefore flows through output transistor M1 and chopping transistor M15 to resistor R4 in current mirror 21A. In current mirror 21A, amplifier A2 generates a voltage similar to the voltage generated in current mirror 20A by amplifier A1 to thereby drive the gate of output transistor M2 in current mirror 21A such that the source of output transistor M2 is coupled through chopping transistor M13 to the lower terminal of resistor R3 and the voltage across resistor R3 in current mirror 21A is the same as the voltage across resistor R4 of current mirror 21A. Again, that precisely twice-mirrored base current of sensing transistor Q1 is thereby returned via conductor 2 to the emitter of sensing transistor Q1. Also, the chopping switches embedded in amplifiers A1 and A2 function to swap the gain polarity of the amplifiers between the two chopping states.

It should be appreciated that open loop gain errors are not corrected by chopping. For a 2 volt output (2 volts being an approximate gate voltage on the output source follower transistor) of an amplifier with 80 dB gain, this leaves an approximately 200 microvolt error that is not corrected. This error will be most significant for sense-transistor β values of 0.1-0.2 because the resulting mirrored sensing transistor base current correction error will add to the smallest value of sensing transistor collector current, which occurs when β has its lowest value. The 200 microvolt error across a 4 kilohm resistor (i.e., R1, R2, R3, or R4) would contribute 50 nano-amperes of error current to an 11 micrompere sensing transistor collector current, or about 0.5% or 1.5 degrees Centigrade to the measurement of the sensing transistor junction temperature.

Advantageously, switching the parallel resistor configuration for each value of the excitation current I1 (i.e., for each of the ratioed excitation current values $I_{UNIT}$, $2 \times I_{UNIT}$, $10 \times I_{UNIT}$, $20 \times I_{UNIT}$, as subsequently described with reference to FIG. 7, results in the same percentage error in the mirrored currents, so the sensitivity to the change in the $V_{GS}$ of the output transistors (e.g., M1 and M2) between the two currents is reduced. If the change in the $V_{GS}$ of the output transistor is less than 200 millivolts (which is true for a 20-to-1 change between the minimum and maximum target values of excitation current I1 to be forced through sensing transistor Q1), then the temperature measurement error is reduced by a factor of approximately 10. This leaves an error of about 0.15 degrees Centigrade for low β, and the error decreases as the β of sensing transistor Q1 increases. Switching the size of the output transistor as the excitation current changes in magnitude further reduces the change in amplifier output voltage, almost entirely eliminating this error by scaling the output transistor size, by selecting output transistor segments, e.g., output transistor segments 47, 49, 51 and 53, according to the magnitude of I1 (i.e., based on whether I1 is equal to $I_{UNIT}$, $2 \times I_{UNIT}$, $10 \times I_{UNIT}$, or $20 \times I_{UNIT}$) in the example of FIG. 5).

Figure 5B:
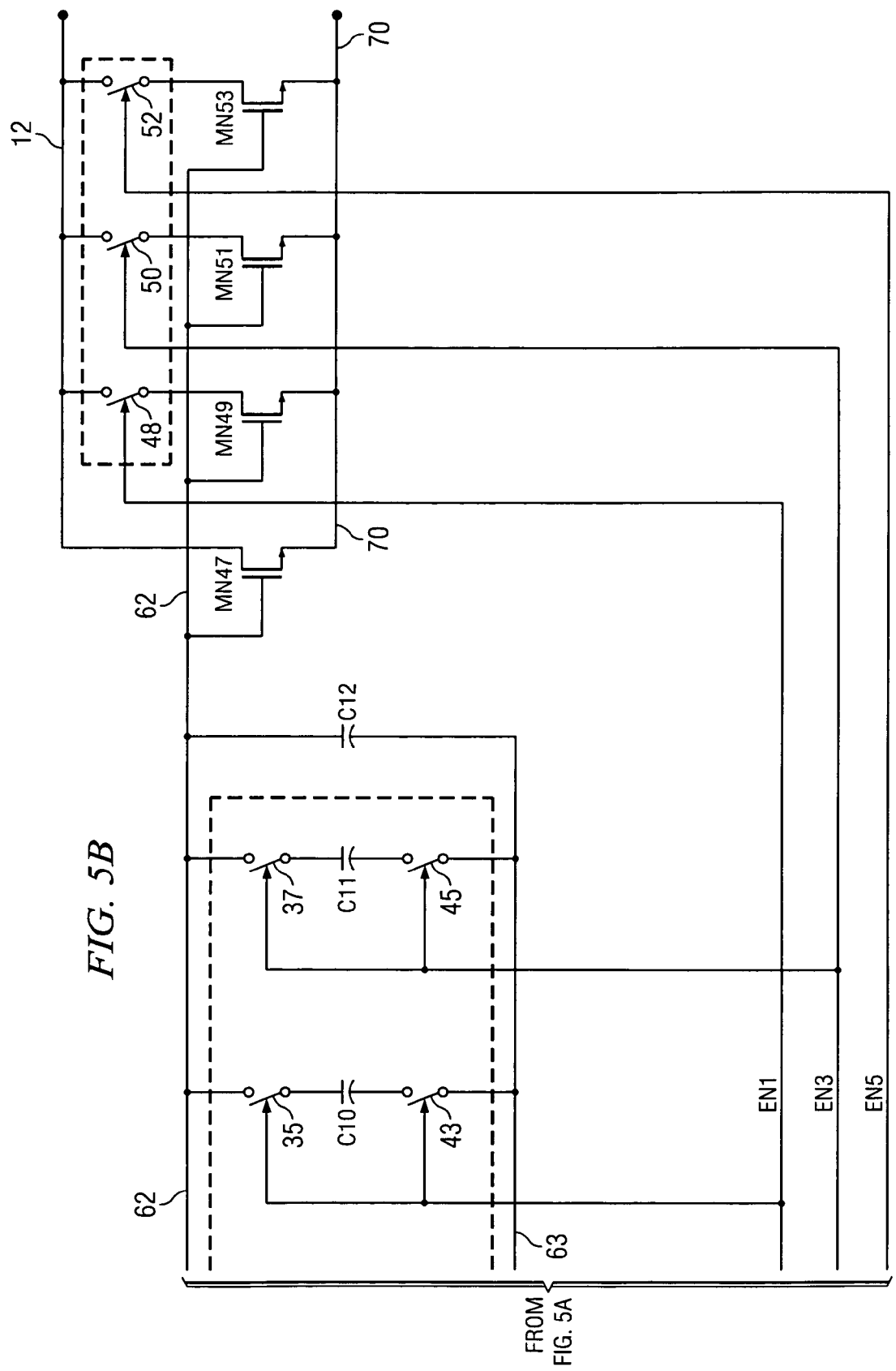
FIG. 5 is a schematic diagram of a practical implementation of amplifier A1 in FIGS. 3 and 4.

FIG. 5 shows a schematic diagram of an implementation of amplifier A1 of current mirror 20A in FIG. 4. Amplifier A2 of current mirror 21A can be implemented in a generally similar manner, but using N-channel rather than P-channel input transistors. Referring to FIG. 5, amplifier 18 includes an input stage including source-coupled P-channel input transistors MP16 and MP17 having their sources coupled to $V_{DD}$ by series-coupled P-channel cascode transistor MP13, tail current source bias transistor MP10, and tail current resistor R10. The drains of input transistors MP16 and MP17 are connected to input conductors of a conventional folded cascode stage having output conductors 60 and 61. The upper portion of the folded cascode stage in FIG. 5 includes resistor R11, P-channel transistor MP11, and P-channel transistor MP14 coupled in series between $V_{DD}$ and output conductor 60, and also includes resistor R12, P-channel transistor MP12, and P-channel transistor MP15 coupled in series between $V_{DD}$ and output conductor 61. The lower portion of the folded cascode stage includes resistor R13, N-channel transistor MN12, and N-channel transistor MN 10 coupled in series between ground and output conductor 60, and also includes resistor R14, N-channel transistor MN13, and N-channel MN11 coupled in series between ground and output conductor 61. Switches 31 and 39 are controlled by a conventional output chopping signal CHOP2, and switches 33 and 41 are controlled by a conventional chopping signal CHOP1.

Output chopping switch 31 is connected between conductor 60 and conductor 62. Output chopping switch 33 is connected between conductor 61 and conductor 62. Output chopping switch 39 is connected between conductor 61 and a conductor 63 which is connected to the gates of N-channel folded cascode transistors MN12 and MN13. Output chopping switch 41 is connected between conductor 63 and output conductor 60. Chopping switches 31, 33, 39 and 41 in FIG. 5 are additional chopping switches which function to change the gain polarity in amplifiers A1 and A2 to maintain the feedback as negative feedback during both chopping states when the feedback is alternately changed between the (−) inputs and the (+) inputs by chopping switches M10 and M11 for A1 and M12 and M13 for A2 in FIG. 4.

The source of N-channel output transistor MN47 is connected to output conductor 70 and the drain thereof is connected to conductor 71. The gate of output transistor MN47 is connected to conductor 62. The source of N-channel output transistor MN49 is connected to output conductor 70 and the drain thereof is connected by switch 48 to conductor 71. The gate of output transistor MN49 is connected to conductor 62. The source of N-channel output transistor MN51 is connected to output conductor 70 and the drain thereof is connected by switch 50 to conductor 71. The gate of output transistor MN51 is connected to conductor 62. The source of N-channel output transistor MN53 is connected to output conductor 70 and the drain thereof is connected by switch 52 to conductor 71. The gate of output transistor MN53 is connected to conductor 62.

Switches 48, 50, and 52 are controlled by EN1, EN3, and EN5, respectively. Output transistors MN47, MN49, MN51 and MN53 can be considered to be output transistor segments which in combination constitute a scalable version of the output transistor M1 in the example of FIG. 4. Transistors MN47, MN49, MN51 and MN53 all form part of the output transistor of the amplifier, for example output transistor M1 in FIG. 4. Depending on the amount of ratioed target excitation current I1 ($I_{UNIT}$, $2 \times I_{UNIT}$, $10 \times I_{UNIT}$, $20 \times I_{UNIT}$) selected to flow in sensing transistor Q1 (FIG. 4), the effective size of output transistor M1 can be scaled by switching transistors MN49, MN51, and/or MN53 in parallel with transistor MN47 in FIG. 5. Output transistor segment MN47 is always active in amplifier output transistor M1. Turning on switches 48, 50, and 52 in FIG. 5 in response to EN1, EN3, and/or EN5 couples output transistor segments MN47, MN51, and/or MN53 in parallel with transistor MN47 according to the present target value of the excitation current I1 produced by current source 13 (FIG. 4).

The target values of total excitation current I1 used to detect the value of β of sensing transistor Q1 are scaled according to a 1, 2, 10, or 20 scale factor. That is, the target values of excitation current I1 are $I_{UNIT}$, $2 \times I_{UNIT}$, $10 \times I_{UNIT}$ or $20 \times I_{UNIT}$. By scaling the size of the output transistor M1 (FIG. 4) in the same manner as the target value of the excitation current I1, the same $V_{GS}$ voltage is achieved for the composite output transistor MN47,49,51 which forms amplifier output transistor M1. This reduces the open loop gain requirements to achieve the desired accuracy in amplifier 18 as shown in FIG. 5, because the amplifier output voltage is the same irrespective of which target value of I1 is currently selected.

A compensation capacitor C12 is connected between conductors 62 and 63 of FIG. 5. Another compensation capacitor C10 has an upper terminal coupled by switch 35 to conductor 62 and a lower terminal coupled by switch 43 to conductor 63. Switches 35 and 43 are controlled by enable signal EN2. Another compensation capacitor C11 has an upper terminal coupled by switch 37 to conductor 62 and a lower terminal coupled by switch 45 to conductor 63. Switches 37 and 45 are controlled by EN3.

Switches 35, 37, 43, and 45 function to adjust the amount of frequency compensation capacitance to be used in amplifier 18. Compensation capacitance C12 is permanently connected between conductors 62 and 63 and provides a minimum amount of frequency compensation, (to provide the highest possible frequency of operation). Switches 35 and 43 allow capacitance C10 to be added to the capacitance of compensation capacitor C12, and switches 37 and 45 allow capacitance C11 to be added to the capacitance of compensation capacitor C12, so as to increase the amount of frequency compensation of amplifier 18 and thereby decrease its bandwidth. The overall feedback response of amplifier 18 in FIG. 5 thus can be adjusted according to how much target excitation current I1 has been selected to flow in sensing transistor Q1.

In one embodiment of the invention, different target values of I1 are selected from a stored table/list by means of a simple algorithm to estimate the value of 1 of sensing transistor Q1, and the frequency response of amplifier 18 can be changed accordingly to allow corresponding adjustment of the feedback loop response so as to obtain more optimum signal settling time of the voltage V2-V3 in FIG. 4.

It should be appreciated that the settling time of the $V_{BE}$ voltage of sensing transistor Q1 is dependent on the impedance seen at the emitter electrode of sensing transistor Q1, which is a function of the emitter current Ie. To keep the settling time fairly constant across the variation of the β of sensing transistor Q1, the value of β can be detected and the collector current target for I1 can be changed depending on the detected value of β. The value of β is detected by comparator 23 in FIG. 3, which compares the output of amplifier A3 applied by conductor 8 to the (−) input of comparator 23 to values of $V_{TH}$ applied to the (+) input of comparator 23.

Variation in the β of sensing transistor Q1 causes variation in the voltage across the various mirror resistors. The base current of sensing transistor Q1, and hence the current in current mirrors 20A and 21A, has a maximum value for transistors with a β of 0.1, whereas a β value of 10 would result in much less current in the resistors of current mirrors is 20A and 21A. Accordingly, in one embodiment of the invention each of resistors R1 and R2 in current mirror 20A has a resistance which is selectable according to a selected value of excitation current I1, to reduce the resulting voltage variation across those resistors (so the effect of the amplifier input offset voltage can be kept small).

Figure 6:
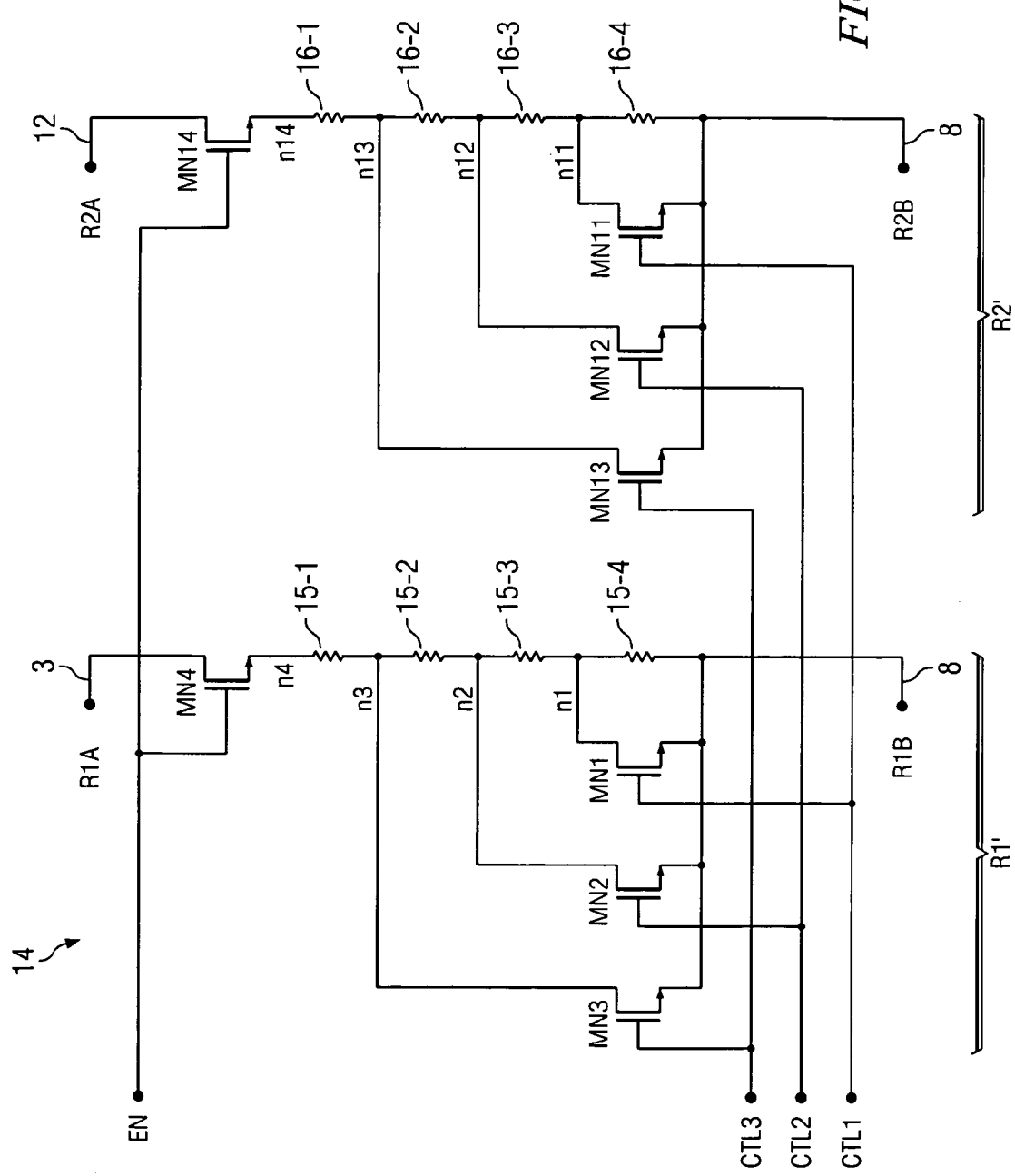
FIG. 6 is a schematic diagram showing part of an implementation of a current mirror resistor in FIGS. 3 and 4.

FIG. 6 is a schematic diagram of each leg of a switched resistor circuit 14 that can be used in one implementation of resistors R1 and R2 in FIGS. 3 and 4. Adjusting or "scaling" the values of the resistances R1' and R2' in switched resistor circuit 14 in FIG. 6 is performed in response to the subsequently described detected value of the β of sensing transistor Q1. FIG. 7 shows how a number of the switched resistor circuits 14 of FIG. 6 can be connected together to provide resistors R1 and R2 in FIG. 3 or FIG. 4 according to target values of the excitation current I1 which are selected to be forced through sensing transistor Q1. It should be appreciated that providing 1, 2, 10, or 20 parallel groups of switched resistor circuits 6 of FIG. 6 is performed in response to the generating of the ratioed emitter excitation currents I1 equal to $I_{UNIT}$, $2 \times I_{UNIT}$, $10 \times I_{UNIT}$, or $20 \times I_{UNIT}$ to obtain equal ratioed collector currents of sensing transistor Q1, as in FIG. 7. It should be understood that the actual magnitude of the unit current $I_{UNIT}$ and the actual value of each resistor segment R1' and R2' in the switched resistor circuit of FIG. 6 depend on the detected value of the β of sensing transistor Q1.

Switched resistor circuit 14 in FIG. 6 includes a string of resistors or resistive segments 15-1, 15-2, 15-3, and 15-4. The upper terminal R1A of resistor 15-1 can be connected by N-channel enable transistor MN4 to conductor 3 in FIG. 4. The lower terminal R1B of resistor 15-4 can be connected to conductor 8 in FIG. 4. A junction between resistors 15-1 and 15-2 is connected to the drain of N-channel transistor MN3, the source of which can be connected to conductor 8. Similarly, a junction between resistors 15-2 and 15-3 is connected to the drain of N-channel transistor MN2, the source of which can be connected to conductor 8, and a junction between resistors 15-3 and 15-4 is connected to the drain of N-channel transistor MN1, the source of which can be connected to conductor 8. The gates of transistors MN1, MN2, and MN3 are connected to control signals CTL1, CTL2, and CTL3, respectively, which are generated by subsequently described β detection logic 40 in FIG. 7.

Switched resistor circuit 14 also includes another string of resistors 16-1, 16-2, 16-3, and 16-4. The upper terminal R2A of resistor 16-1 can be connected by N-channel enable transistor MM14 to conductor 12 in FIG. 4. The lower terminal R2B of resistor 16-4 can be connected to conductor 8. A junction between resistors 16-1 and 16-2 is connected to the drain of N-channel transistor MN13, the source of which can be connected to conductor 8. Similarly, a junction between resistors 16-2 and 16-3 is connected to the drain of N-channel transistor MN12, the source of which can be connected to conductor 8, and a junction between resistors 16-3 and 16-4 is connected to the drain of N-channel transistor MN11, the source of which can be connected to conductor 8. The gates of transistors MN11, MN12, and MN13 are connected to control signals CTL1, CTL2, and CTL3, respectively.

Figure 7:
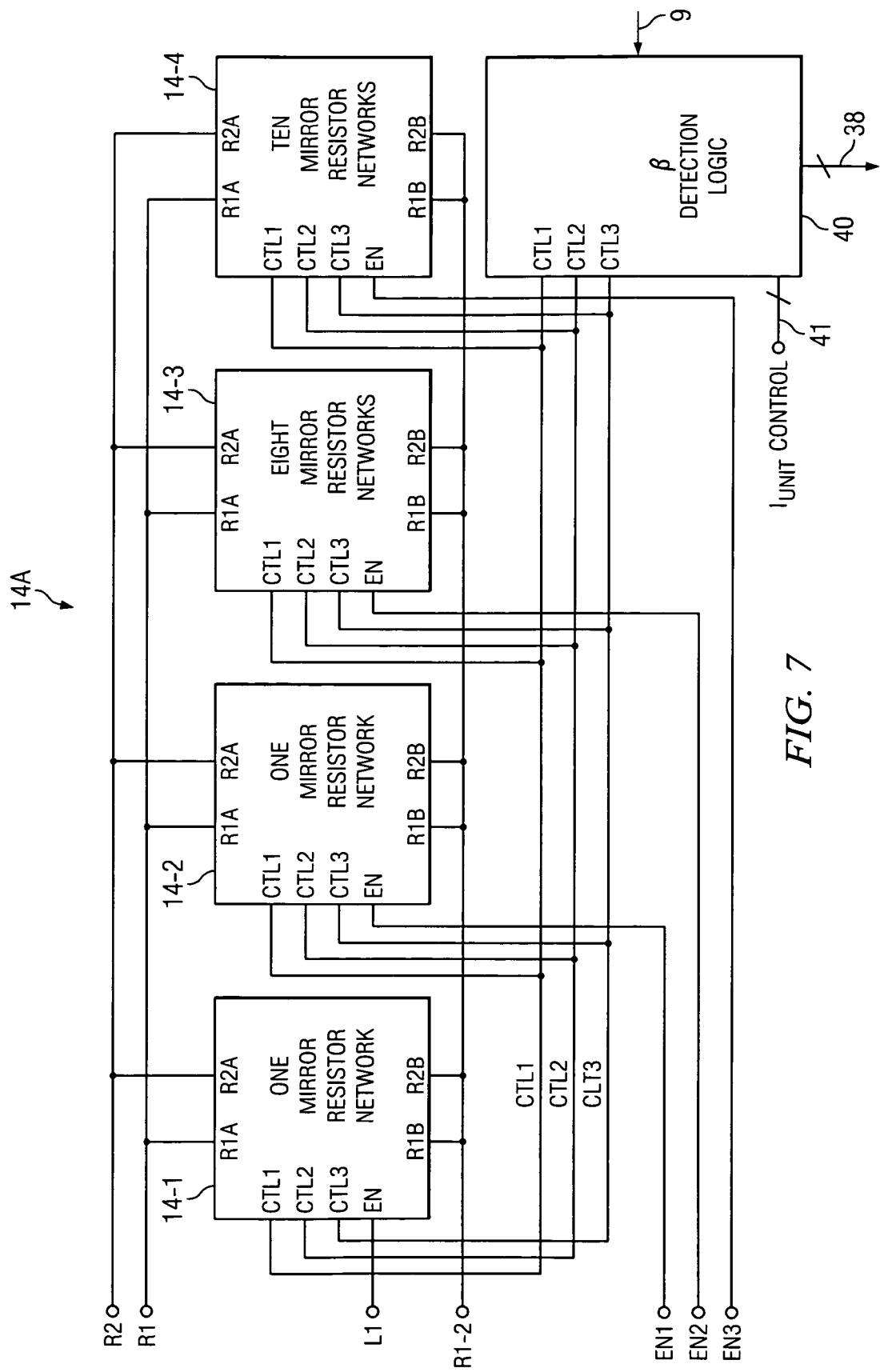
FIG. 7 is a schematic diagram illustrating how current mirror resistors in FIGS. 3 and 4 can be switched into various parallel-connected configurations.

Note that the term R1' in FIG. 6 indicates the portion of each switched resistor circuit 14 in scaled resistor array 14A of FIG. 7 that contributes to the resistance R1 in current mirror 20A, and similarly, the term R2' in FIG. 6 indicates the portion of each switched resistor circuit 14 in scaled resistor array 14A of FIG. 7 that contributes to the resistance R2 in current mirror 20A. Control signals CTL1, CTL2 and CTL3 adjust the effective resistance of resistors R1' and R2' in accordance with the detected value of β of sensing transistor Q1.

The gates of enable transistors MN4 and MN14 are connected to receive an enable signal EN, in order to enable current flow through the two strings R1' and R2' of resistors in FIG. 6 so they can be selectively connected in parallel in accordance with the selected value of excitation current I1 as subsequently described with reference to FIG. 7.

When control signal CTL1 is high or "active", transistor MN1 in FIG. 6 is on and electrically short-circuits resistor 15-4. When CTL2 is high, transistor MN2 is on and electrically short-circuits resistors 15-3 and 15-4. When CTL3 is high, transistor MN3 is on and electrically short-circuits resistors 15-2, 15-3 and 15-4. Therefore, the three control signals set the value of R1 in FIG. 6 to one of four possible values. Similarly, when CTL1 is high, transistor MN11 is on and electrically short-circuits resistor 16-4. When CTL2 is high, transistor MN12 is on and electrically short-circuits resistors 16-3 and 16-4. When CTL3 is high, transistor MN13 is on and electrically short-circuits resistors 16-2, 16-3 and 16-4. Therefore, the three control signals set the value of R2 in FIG. 6 to one of four possible values.

FIG. 7 shows a block diagram of how a "scaled" resistor array implementation 14A of resistors R1 and R2 in current mirror 20A of FIG. 4 can be arranged as 1, 2, 10, or 20 parallel "segments" each of which is formed by a separate switched resistor circuit 14 as shown in FIG. 6. The 20 parallel switched resistor circuits 14 are grouped as segments 14-1, 14-2, 14-3, and 14-4, wherein segments 14-1 and 14-2 each consist of one switched resistor circuit 14. Segment 14-3 consists of eight switched resistor circuits 14, and segment 14-4 consists of 10 switched resistor circuits. This allows the values of resistors R1 and R2 in FIG. 4 to be scaled according to the values of R1' and R2' in each of the switched resistor circuits 14.

Control signals CTL1, CTL2 and CTL3 are generated by β detection logic circuit 40 in FIG. 7, which implements the subsequently described flowchart of FIG. 9. β detection logic circuit 40 receives an input signal from comparator 23, on conductor 9. β detection logic circuit 40 contains the previously mentioned list of values of I1, and also has an output that selects the magnitude of $I_{UNIT}$ from a predetermined list of desired values thereof stored in β detection logic 40. β detection logic circuit 40 also includes lists of desired $V_{TH}$ values and resistor values. Detection logic circuit 40 also produces outputs on bus 38 which are decoded by decoder 28 in subsequently described FIG. 8 to select the desired value of programmable threshold voltage $V_{TH}$ by turning on one of transistors $M_A$, $M_B$, $M_C$, $M_D$, $M_E$, $M_F$, $M_G$, $M_H$, $M_I$, $M_J$. β detection logic circuit 40 can be readily implemented by means of a simple state machine.

FIG. 7 shows that 1, 2, 10 or 20 switched resistor circuits 14 of FIG. 6 can be selectively coupled in parallel by means of the enable transistors MN4 and MN14 in of each of switched resistor circuits 14 to provide selected values of resistors R1 and R2 in current mirror circuit 20 in FIG. 3 or current mirror circuit 20A in FIG. 4 in conjunction with selected target values of the excitation current I1 produced by current source 13, equal to $I_{UNIT}$, $2 \times I_{UNIT}$, $10 \times I_{UNIT}$, or $20 \times I_{UNIT}$. Enable transistors MN4 and MN14 allow 1, 2, 10, or 20 of the switched resistor circuits 14 of FIG. 6 that form scalable resistor circuit 14A of FIG. 7 to be turned on at any given time. The values of EN1, EN2, and EN3 are selected in accordance with the presently selected value of excitation current I1. This allows the resistors R1' and R2' of switched resistor circuits 14 to be selected so as to be combined into 1, 2, 10, or 20 parallel switched resistor circuits as indicated in FIG. 7 to provide the needed values of R1 and R2 in current mirror 20A of FIG. 4 in accordance with the presently selected excitation current value of $I_{UNIT}$, $2 \times I_{UNIT}$, $10 \times I_{UNIT}$, or $20 \times I_{UNIT}$.

Switched resistor network 14-1 in FIG. 7 is always enabled, as indicated by the signal L1 applied to the enable input EN thereof. The resistances R1' and R2' of resistor network 14-1 each have a value determined by control signals CTL1,2,3, which are generated by β detection circuit 40 in accordance with the iterative algorithm of FIG. 9 on the basis of the detected value of β of sensing transistor Q1. If the value of excitation current I1 forced through sensing transistor Q1 is doubled, then the enable signal EN1 adds switched resistor circuit 14-2 in parallel with the switched resistor circuit 14-1. The signals EN 1,2,3 are based on which of the possible successively "ratioed" values of excitation current I1 (equal to $I_{UNIT}$, $2 \times I_{UNIT}$, $10 \times I_{UNIT}$, or $20 \times I_{UNIT}$) is currently being forced into sensing transistor Q1. With twice the amount of current flowing through the 2 resistors 14-1 and 14-2 connected in parallel, the same voltage drop is produced across resistor segments R1' and R2'. If a scaling factor of 10 is needed, the signal EN2 connects the eight switched resistor networks 14 included in block 14-3 of FIG. 7 in parallel with the single switched resistor circuits 14 in blocks 14-1 and 14-2.

Figure 8:
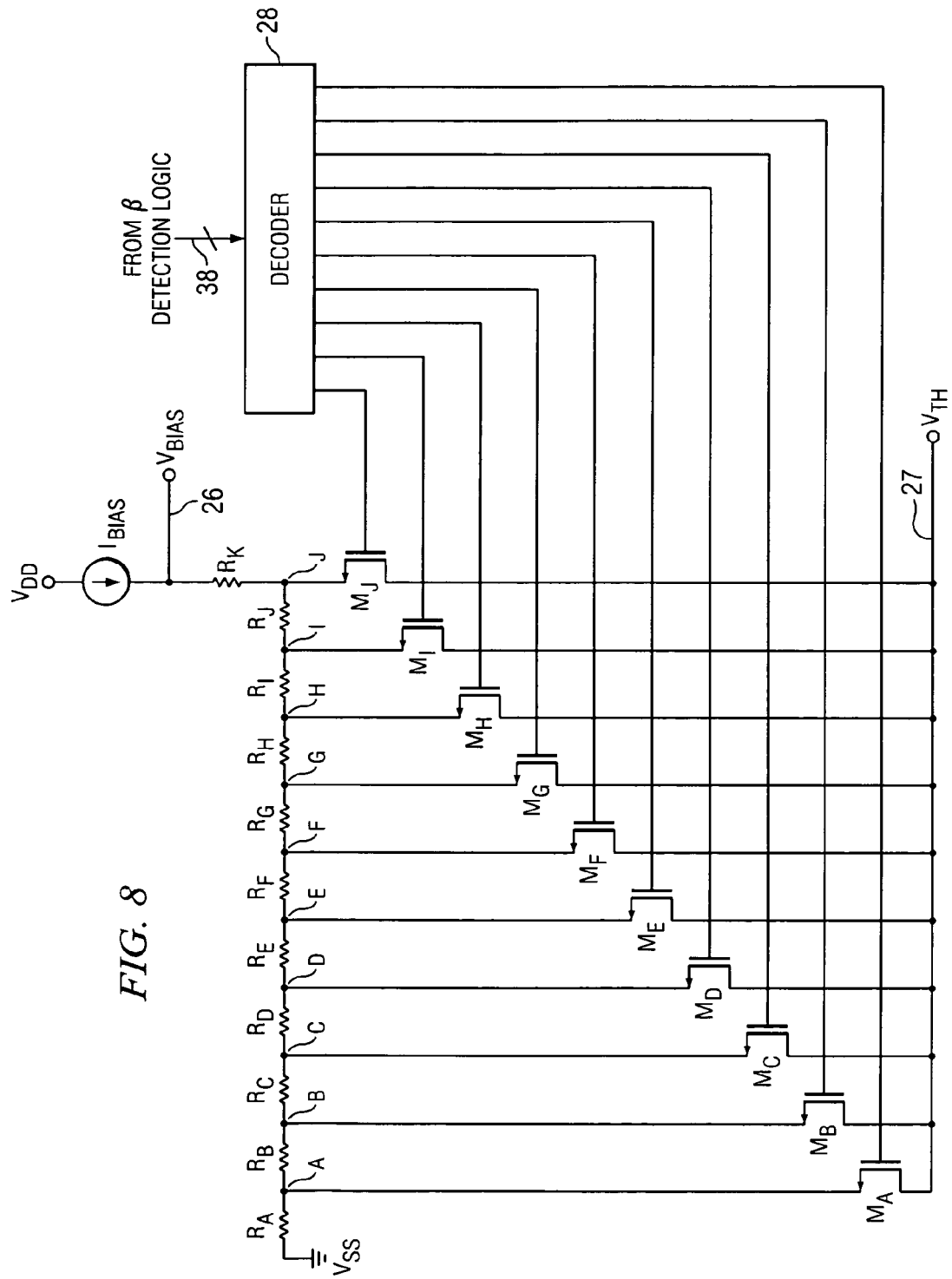
FIG. 8 is a schematic diagram of a programmable voltage generator which can be used to generate the voltage $V_{Ref}$ and the voltage $V_{TH}$ in FIGS. 3 and 4.

FIG. 8 shows a programmable voltage generator circuit which can be used to generate both programmable reference voltage $V_{Ref}$ and programmable threshold voltage $V_{TH}$. The programmable voltage generator circuit includes a series-connected string of resistors $R_A$, $R_B$, $R_C$, $R_D$, $R_E$, $R_F$, $R_G$, $R_H$, $R_I$, $R_J$, and $R_K$ coupled between $V_{SS}$ and a conductor 26 on which a voltage $V_{BIAS}$ is produced. A current source $I_{BIAS}$ supplies a suitable bias current into the resistor-string in order to produce $V_{BIAS}$. The value of $V_{Ref}$ applied to the (+) input of amplifier A3 is equal to the voltage difference between $V_{BIAS}$ and $V_{TH}$.

A plurality of N-channel transistors $M_A$, $M_B$, $M_C$, $M_D$, $M_E$, $M_F$, $M_G$, $M_H$, $M_I$, $M_J$ each have a drain connected to conductor 27 on which programmable threshold voltage $V_{TH}$ is produced and applied to the (+) input of comparator 23 (FIG. 4). The gate of each of transistors $M_A$, $M_B$, $M_C$, $M_D$, $M_E$, $M_F$, $M_G$, $M_H$, $M_I$, $M_J$ is connected to a corresponding output of a conventional decoder 28 which decodes the previously mentioned signals received on bus 38 from β detection logic 40. The drain of each of switching transistors $M_A$, $M_B$, $M_C$, $M_D$, $M_E$, $M_F$, $M_G$, $M_H$, $M_I$, $M_J$ is connected to a successive node A between resistors $R_A$ and $R_B$, node B between resistors $R_B$ and $R_C$, node C between resistors $R_C$ and $R_D$, and so forth to node J between resistors $R_J$ and $R_K$. Switching transistors $M_A$, $M_B$, $M_C$, $M_D$, $M_E$, $M_F$, $M_G$, $M_H$, $M_I$, $M_J$ operate such that only one switching transistor at a time is turned on to set the programmable threshold voltage $V_{TH}$.

In accordance with the present invention, an automatic β detection operation adjusts the collector target current in sensing transistor Q1 and the resistance of each leg of the switched resistor circuits 14 to maintain particular ranges of voltage across scaled resistor network 14A of FIG. 7 according to the presently detected value of β the of sensing transistor Q1. Detection of the value of β for sensing transistor Q1 is achieved by incrementing through a stored list of possible target values of excitation current I1 (but not the values $I_{UNIT}$, $2 \times I_{UNIT}$, $10 \times I_{UNIT}$, $20 \times I_{UNIT}$) and through a list of possible values of resistance R1 until the voltage drop across the resistor network 14A of FIG. 7 is greater than $V_{Ref}$.

The selected target excitation current value I1 forced through sensing transistor Q1 is incremented by means of a simple iterative algorithm in order to determine or detect the value of β of sensing transistor Q1. For a very low value of β of sensing transistor Q1 (wherein its base current is relatively high), a lower value of R1 is used, so only the first resistive segment 15-1 in FIG. 6 is used. For high values of β (wherein the base current of Q1 is small), a relatively large value of R1 is needed which includes all four of the segments 15-1,2,3,4 shown in FIG. 6. The above mentioned iterative algorithm determines values of R1 between maximum and minimum values thereof.

Figure 9:
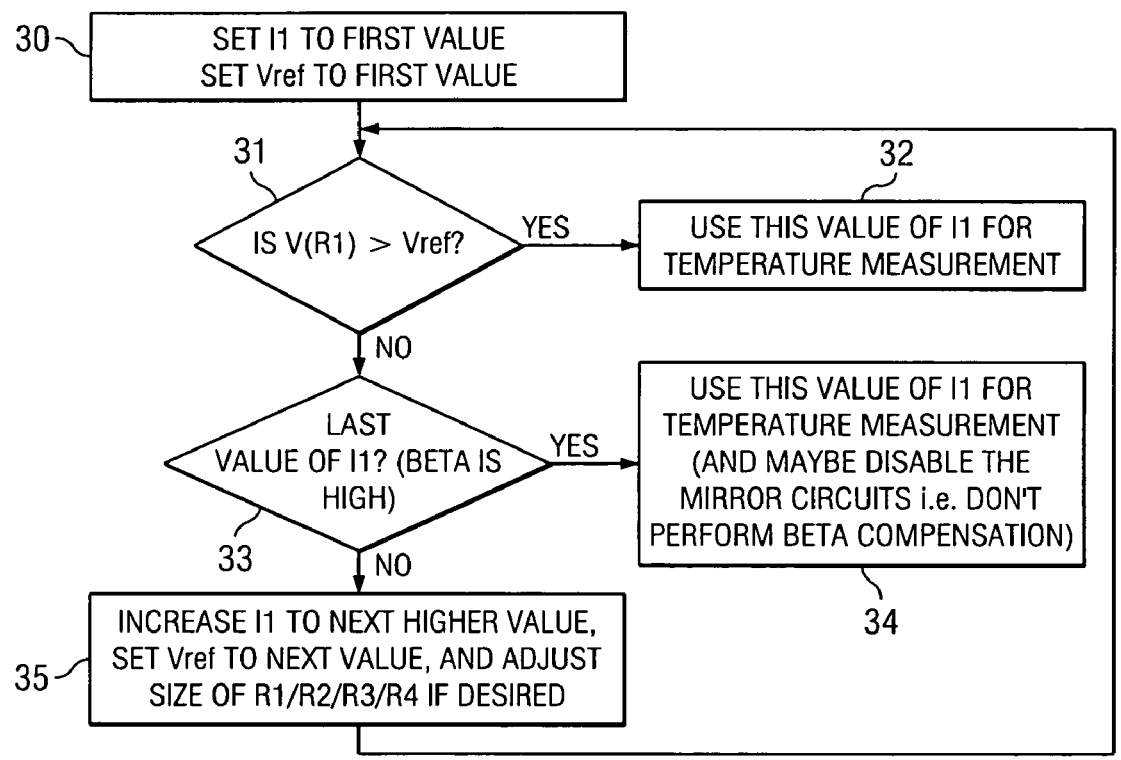
FIG. 9 is a flowchart of a method that can be utilized in conjunction with the circuit of FIGS. 3 and 4 to detect the value of β of sensing transistor Q1.

FIG. 9 shows a flowchart of the foregoing method/algorithm to detect the value of β of sensing transistor Q1, wherein the first step is to set the current of current source 13 to a first lowest value of a list of increasing scaled $I_{UNIT}$ values (e.g., a first lowest value of a list of values of $20 \times I_{UNIT}$) and to set $V_{Ref}$ to a suitable first value, as indicated in block 30. In decision block 31, the algorithm determines whether the voltage drop V(R1) generated across resistor R1 by the base current Ib of sensing transistor Q1 is greater than the first value of $V_{Ref}$, in order to determine whether β is above or below a certain value. If β is less than the certain value, the algorithm uses that value of β, but if β is greater than the certain value, then the algorithm moves to the next value in each of the previously mentioned stored lists of values of β and $V_{TH}$ and the previously mentioned stored list of resistor values, and then repeats the loop through decision blocks 31 and 33. (It should be understood that $V_{TH}$ sets a threshold value which corresponds to a certain value of the base current Ib of sensing transistor Q1 and hence to a predetermined level of β, and is based on whether comparator 23 trips above or below the predetermined value of threshold voltage $V_{TH}$. That determines whether β is either above or below a predetermined value and whether the desired value of excitation current I1 (i.e., $I_{UNIT}$, $2 \times I_{UNIT}$, $10 \times I_{UNIT}$, or $20 \times I_{UNIT}$) has been found.)

If the voltage drop across resistor R1 is less than $V_{Ref}$, this means that the β of sensing transistor Q1 is higher than the threshold value of β corresponding to the present value of threshold voltage $V_{TH}$. If the determination decision block 31 is affirmative, this means that the appropriate β range has been found, and then the presently selected value of excitation current I1 is utilized to generate a value of V2-V3 that is measured and used by integrating ADC 6 to compute the temperature of sensing transistor Q1.

However, if the determination of decision block 31 is negative, then in decision block 33 the algorithm determines whether the previous value of current produced by current source 13 is the last value of excitation current I1 because the most recently detected or determined value of the β of sensing transistor Q1 is "high" ("high" typically means between 10 and 100). If this determination is affirmative, then the last value of excitation current I1 in the previously mentioned stored list is utilized to generate a value of V2-V3 used by integrating ADC 6 to compute the temperature of sensing transistor Q1. (In this case, current mirror circuits 20 and 21 in FIG. 3 or 20A and 21A in FIG. 4 may be disabled in order to prevent them from performing β compensation.)

If the determination of decision block 33 is negative, then the value of excitation current I1 produced by current source 13 is increased or incremented to the next acceptable value in the above mentioned list of values of $I_{UNIT}$. The value of $V_{Ref}$ is set to its next acceptable value from a predetermined list.

(In one implementation, the value of $V_{Ref}$ used depends on which range of β was detected for the previous temperature measurement so as to implement a small amount of hysteresis in the algorithm in order to avoid frequent switching from one range to the other when the β is near a range selection boundary.) If desired, the values of resistors R1, R2, R3 and R4 can be adjusted accordingly. In any case, the algorithm then reenters decision block 31 and continues repeating the foregoing process until the needed values of $I_{UNIT}$, the needed resistor values and the needed values of $V_{TH}$ (i.e., the needed values of CTL1, CTL2, and CTL3), are selected to allow the temperature of sensing transistor Q1 to be computed.

Since the target collector current Ic for sensing transistor Q1 is changed when switching from one range of β to another range, the error in measurement of the temperature of sensing transistor Q1 caused by series resistance in the transistor changes. The resistance correction algorithm can readily be operated to keep this change to less than 0.1 degrees Centigrade.

To summarize, the present invention provides current mirroring circuitry for feeding the base current of a temperature sensing transistor back to its emitter such that a target excitation current applied to the emitter along with feedback of the base current results in the collector current of the sensing transistor being precisely equal to the target current, so as to allow precise control of the collector current without direct connection of associated circuitry to the collector. Specifically, the target current is applied to the emitter, the resulting base current is mirrored by a first current mirror, and the resulting mirrored base current is again mirrored by a second current mirror. The output of the second current mirror is returned to the emitter of the sensing transistor and summed with the target current, which causes the collector current to be precisely equal to the target current. Chopping and scaling methods and associated circuitry may be used in the current mirror circuits so that, when coupled with integrating ADC measurements, errors in the current mirror circuits average out to zero. In some embodiments of the invention, the sizes of the current mirror output transistors, the resistances of the current mirror resistors, and/or values of frequency compensation capacitance of the current mirrors are adjusted in accordance with the selected value of excitation current I1 (i.e., $I_{UNIT}$, $2 \times I_{UNIT}$, $10 \times I_{UNIT}$, or $20 \times I_{UNIT}$). Specifically, the number of switched resistor circuits 14 coupled in parallel to provide the current mirror resistors, the size (W/L) of a current mirror output transistor M1, and/or the amount of frequency compensation capacitance are determined according to which of the ratioed values (e.g., $I_{UNIT}$, $2 \times I_{UNIT}$, $10 \times I_{UNIT}$, $20 \times I_{UNIT}$) of the excitation current I1 is currently being forced through the emitter of sensing transistor Q1. In some embodiments of the invention, the β of the sensing transistor is iteratively detected, and values of the target current are adjusted accordingly.

According to a described embodiment of the invention, the needed accuracy in the emitter current of sensing transistor Q1 is achieved by using the detected value of the β thereof to select a target excitation current from a stored list of values. The resistance value of a particular segment and the actual excitation current target value I1 are scaled based directly on the detected value of β of Q1.

While the invention has been described with reference to several particular embodiments thereof, those skilled in the art will be able to make various modifications to the described embodiments of the invention without departing from its true spirit and scope. It is intended that all elements or steps which are insubstantially different from those recited in the claims but when it perform substantially the same functions, respectively, in substantially the same way to achieve the same result as what is claimed are within the scope of the invention. For example, although an averaging ADC is disclosed in the described embodiments, the needed analog to digital functions and associated digital processing functions could be accomplished by means of a basic ADC in combination with suitable processing circuitry. Also, some embodiments of the invention do not require that one or more of the size of the amplifier output transistor M1, the resistances such as R1 and R2 in any of the current mirrors, and the frequency compensation capacitances be scaled according to the value of either the excitation current I1 forced to flow in sensing transistor Q1 or a detected value of β.

What is claimed is:

1. A circuit for compensating for variations in the current gain β of a first transistor having a collector coupled to a first reference voltage, the circuit comprising:
    a first current mirror circuit having:
        a first amplifier with an input coupled to a base of the first transistor; and
        a second transistor coupled to an output of the first amplifier at its gate;
    a second current mirror circuit having:
        a second amplifier with an input coupled to the drain of the second transistor; and
        a third transistor coupled to an output of the second amplifier at its gate and coupled to the emitter of the first transistor at its drain; and
    a current source coupled to the emitter of the first transistor for producing an excitation current to provide emitter current for the first transistor.

2. The circuit of claim 1, wherein the input of the first amplifier further comprises a first input of the first amplifier, and wherein the input of the second amplifier further comprises a first input of the second amplifier, wherein the first input of the first amplifier is coupled to a first terminal of a first resistor, a second input of the first amplifier is coupled to a first terminal of a second resistor and a source of the second transistor, and a second terminal of the second resistor is coupled to a second terminal of the first resistor, and wherein the first input of the second amplifier is coupled to a first terminal of a third resistor, a second input of the second amplifier is coupled to a first terminal of a fourth resistor and a source of the third transistor, a second terminal of the third resistor and a second terminal of the fourth resistor being coupled to a second reference voltage, the second transistor having a drain coupled to the first input of the second amplifier, and the third transistor having a drain coupled to the emitter of the first transistor.

3. The circuit of claim 2, wherein the first transistor is a temperature sensing transistor, and wherein the emitter of the first transistor is coupled to a first input of an averaging analog to digital converter and wherein the base of the first transistor is coupled to a second input of the averaging analog to digital converter.

4. The circuit of claim 3, wherein each of the first amplifier and the second amplifier are chopper-stabilized to reduce input offset voltages thereof.

5. The circuit of claim 3, wherein the emitter of the first transistor is coupled to the first input of the averaging analog to digital converter by means of a fifth resistor and wherein the base of the first transistor is coupled to the second input of the averaging analog to digital converter by means of a sixth resistor, a capacitor being coupled between the first and second inputs of the averaging analog to digital converter to form an anti-aliasing filter that also includes the fifth and sixth resistors.

6. The circuit of claim 5, wherein the first transistor is a vertical PNP transistor and wherein the second transistor is a N-channel MOS transistor and the third transistor is a P-channel MOS transistor.

7. The circuit of claim 3, including a third amplifier having a first input coupled to a third reference voltage, a second input coupled to the base of the first transistor, and an output coupled to the second terminal of the first resistor and the second terminal of the second resistor.

8. The circuit of claim 7, including a comparator having a first input coupled to a fourth reference voltage representative of an estimated value of the current gain β of the first transistor, a second input coupled to the output of the third amplifier, and an output for indicating whether a present value of the β of the first transistor is greater than or less than a predetermined value of the β of the first transistor represented by the fourth reference voltage.

9. The circuit of claim 8, including β detection circuitry for incrementally setting multiple values of the excitation current to cause the first transistor to produce corresponding values of its base current and thereby cause corresponding voltages to be produced on the second input of the comparator.

10. The circuit of claim 9, including circuitry for causing the current source to cause the excitation current to have one of the values according to a stored list of values of IUNIT, wherein IUNIT is a predetermined minimum value of the excitation current.

11. The circuit of claim 9, wherein the circuit further comprises a plurality of compensation capacitors which are selectable in accordance with the values of the excitation current.

12. The circuit of claim 9, wherein the fourth reference voltage is programmable, wherein values of the excitation current are programmable, wherein values of the fourth reference voltage are stored in a first list in the β detection circuitry, and wherein the β detection circuitry increments the multiple values of the excitation current using the values stored in a second list in the β detection circuitry.

13. The circuit of claim 9, wherein the first and second resistors are implemented by means of at least one programmable resistor circuit, and wherein resistances of first and second portions of the programmable resistor circuit are adjustable in response to whether a present β of the first transistor is greater than or less than the predetermined value of the β of the first transistor represented by the fourth reference voltage, wherein the first and second resistors include the first and second, respectively, of the programmable resistor circuit.

14. The circuit of claim 13, wherein the second transistor is composed of multiple segments which are selectable in accordance with values of the excitation current.

15. A method of compensating for variations in current gain β of a sensing transistor having a collector coupled to a first reference voltage, the method comprising:
    causing an excitation current to flow through an emitter of the sensing transistor;
    causing a resulting base current in the sensing transistor to flow into an input of a first current mirror circuit;
    causing a first mirrored current produced by the first current mirror circuit to flow into an input of a second current mirror circuit;
    causing a second mirrored current produced by the second current mirror circuit to flow through the emitter of the sensing transistor to cause a current precisely equal to the excitation current to flow through the collector of the sensing transistor;

chopper-stabilizing each of the first current mirror and the second current mirror to reduce errors associated with the first and second current mirror circuits.

16. The method of claim 15, wherein the method further comprises coupling the emitter of the sensing transistor to a first input of an averaging analog to digital converter and coupling a base of the sensing transistor to a second input of the averaging analog to digital converter and operating the averaging analog to digital converter to measure base-emitter voltages of the sensing transistor produced in response to different values of the excitation current, and determining the temperature of the sensing transistor from the measured base-emitter voltages.

17. The method of claim 15, wherein the method further comprises operating β detection circuitry by incrementing the excitation current to cause the sensing transistor to produce corresponding values of its base current and causing corresponding voltages generated across a first resistor to be compared by means of a comparator to a predetermined reference voltage representative of a predetermined value of the β of the switching transistor to determine a value of the β the sensing transistor.

18. The method of claim 17, wherein the method further comprises setting a value of the excitation current in accordance with the determined value of the β of the sensing transistor.

19. An apparatus comprising:
a first transistor having a first passive electrode, a second passive electrode, and a control electrode; and
a temperature sensor having:
a first current mirror having:
a first amplifier having a first input terminal, a second input terminal, and an output terminal, wherein the first input terminal of the first amplifier is coupled to the control electrode of the first transistor; and
a second transistor having a first passive electrode, a second passive electrode, and a control electrode, wherein the control electrode of the second transistor is coupled to the output terminal of the first amplifier, and wherein the second passive electrode of the second transistor is coupled to the second input terminal of the first amplifier;
a second current mirror having:
a second amplifier having a first input terminal, a second input terminal, and an output terminal, wherein the first input terminal of the second amplifier is coupled to the first passive electrode of the first transistor; and
a third transistor having a first passive electrode, a second passive electrode, and a control electrode, wherein the control electrode of the third transistor is coupled to the output terminal of the second amplifier, and wherein the second passive terminal of the third transistor is coupled to the first passive electrode of the first transistor, and wherein the first passive electrode of the third transistor is coupled to the second input terminal of the second amplifier;
a current source that is coupled to the first passive electrode of the first transistor; and
an analog-to-digital converter (ADC) that is coupled to the first passive terminal of the first transistor and the control electrode of the first transistor.

20. The apparatus of claim 19, wherein the temperature sensor further has a control circuit that is coupled to the control electrode of the first transistor, and wherein the first current mirror further comprises:
a first resistor that is coupled between the control circuit and the first terminal of the first amplifier; and
a second resistor that is coupled between the control circuit and the second passive electrode of the second transistor.

21. The apparatus of claim 20, wherein the apparatus further comprises first and second supply rails, and wherein the control circuit and the second passive electrode of the first transistor are coupled to the first supply rail, and wherein the second current mirror further comprises:
a third resistor that is coupled between the second supply rail and the first input terminal of the second amplifier; and
a fourth resistor that is coupled between the second supply rail and the first passive electrode of the third transistor.

22. The apparatus of claim 21, wherein the control circuit further comprises:
a third amplifier having a first input terminal, a second input terminal, and an output terminal, wherein the first input terminal of the third amplifier is coupled to the control electrode of the first transistor, and wherein the output terminal of the third amplifier is coupled to the first and second resistors; and
a reference voltage generator that is coupled between the first supply rail and the second input terminal of the third amplifier.

23. The apparatus of claim 22, wherein the first and second amplifiers are chopper-stabilized amplifiers.

24. The apparatus of claim 22, wherein the first, second, and third transistors are a PNP transistor, an NMOS transistor, and a PMOS transistor, respectively.

* * * * *